US005473697A

United States Patent [19]

Ishihara

[11] Patent Number: 5,473,697

[45] Date of Patent: Dec. 5, 1995

[54] ECHO GENERATING APPARATUS

[75] Inventor: Masaaki Ishihara, Kanagawa, Japan

[73] Assignee: Sony Corporation, Tokyo, Japan

[21] Appl. No.: 389,983

[22] Filed: Feb. 14, 1995

Related U.S. Application Data

[63] Continuation of Ser. No. 103,745, Aug. 9, 1993, abandoned.

[30] Foreign Application Priority Data

Aug. 21, 1992 [JP] Japan .................................... 4-245511
Aug. 31, 1992 [JP] Japan .................................... 4-257188

[51] Int. Cl.[6] .................................................. H03G 3/00
[52] U.S. Cl. ................................. 381/63; 84/630; 84/707
[58] Field of Search ...................... 84/630, 707, DIG. 26

[56] References Cited

U.S. PATENT DOCUMENTS

| | | | |
|---|---|---|---|
| Re. 30,839 | 12/1981 | Miyamoto | 307/494 |
| 4,039,755 | 8/1977 | Berkovitz | 381/63 |
| 4,195,235 | 3/1980 | Schoeff | 307/494 |
| 4,237,343 | 12/1980 | Kurtin et al. | 381/63 |
| 4,980,914 | 12/1990 | Kunugi et al. | 381/63 |
| 5,043,599 | 8/1991 | Zitta | 307/494 |

*Primary Examiner*—Curtis Kuntz
*Assistant Examiner*—Ping W. Lee
*Attorney, Agent, or Firm*—Jay H. Maioli

[57] ABSTRACT

An echo generating apparatus includes an echo effect generator for producing reverberative echo effect by delaying an input audio signal; a band limit filter for limiting the frequency band of the output signal of the echo effect generator; a first calculator for delivering an output signal by calculating the input audio signal and the output signal of the band limit filter; and a frequency characteristic compensator for emphasizing the signal of the frequency band attenuated by the band limit filters. The echo effect generator consists of a second calculator for calculating the input audio signal and the output signal of the band limit filter, an analog delay means for delaying the output signal of the second calculator, and a clock generator for generating an operation clock signal for the analog delay means. A long reverberative echo time is maintained without the necessity of increasing the number of signal delay stages or enlarging the scale thereof. The apparatus is free from spurious radiation or deterioration of the S/N in the data signal. And the number of required component elements is minimized to curtail the production cost.

15 Claims, 20 Drawing Sheets

ECHO GENERATING APPARATUS

This is a continuation of application Ser. No. 08/103,745 filed Aug. 9, 1993, now abandoned.

BACKGROUND OF THE INVENTION

1. Field of the Invention

The present invention relates to an echo generating apparatus for adding reverberative echo effect to an input signal and, more particularly, to an apparatus adapted for use in a system which gives reverberative echo effect to an audio signal outputted from a microphone.

2. Description of the Related Art

In an echo generating apparatus of the kind mentioned, its one fundamental component is an echo effect generator 1 which produces reverberative echo effect by delaying an input signal as shown in FIG. 1, and undesired noise is generally superposed on the output signal of the echo effect generator 1.

For example, clock noise and so forth are superposed in an analog type apparatus employing a bucket brigade device (BBD) as a signal delay means in the echo effect generator 1. Meanwhile in a digital type apparatus which employs an A-D converter, a memory circuit and a D-A converter, quantization noise and clock noise are superposed.

For the purpose of reducing such noise superposed on the output signal, it is customary to dispose a filter 2 (low-pass filter in most cases) in the following stage of the echo effect generator 1 so as to limit the band width by the filter.

FIGS. 2 and 3 show conventional analog type apparatus of the related art employing a BBD and so forth as a signal delay means in an echo effect generator.

The conventional example of FIG. 2 has a cyclic circuit configuration wherein an input signal is delayed while a BBD 16 is driven by-a clock generator 15, and the signal thus delayed is fed back to be processed by a calculator 17 for calculation with the input signal.

The conventional example of the related art shown in FIG. 3 has a transversal circuit configuration wherein an input signal is delayed sequentially while cascade-connected n-stage BBDs $26_1$–$26_n$ are driven by a clock generator 25, and addition or subtraction is executed in a calculator 27 while the output signals of the n-stage BBDs $26_1$–$26_n$ are multiplied by adequate coefficients respectively.

FIGS. 4 to 6 show conventional digital type apparatus of the related art employing an A-D converter, a memory circuit and a D-A converter as a signal delay means in an echo effect generator.

The conventional example of FIG. 4 has a cyclic circuit configuration wherein an input signal is delayed while an A-D converter 36, a memory circuit 37 and a D-A converter 38 are driven by a clock generator 35, and the signal thus delayed is fed back to be processed by a calculator 39 for calculation with the input signal.

The conventional example of the related art shown in FIG. 5 has a transversal circuit configuration wherein an input signal is delayed sequentially by cascade-connected n-stage memory circuits $47_1$–$47_n$, and addition or subtraction is executed in a calculator 49 while the output signals of the n-stage memory circuits $47_1$–$47_n$ are multiplied by adequate coefficients respectively. And thereafter the calculated signals are converted into analog ones by a D-A converter 48.

In another conventional example of the related art shown in FIG. 6, output signals of n-stage memory circuits $57_1$–$57_n$ are converted into analog ones by n-stage D-A converters $58_1$–$58_n$, and then addition or subtraction is executed in a calculator 59 while the analog signals are multiplied by adequate coefficients respectively.

In each of the conventional examples mentioned above, the noise amplitude in the output signal can be reduced by narrowing the pass band of the filter 2 employed for noise reduction, but a problem arises therefrom that there is also narrowed the frequency band of the signal itself received from the input terminal and delivered from the output terminal with addition of reverberative echo effect.

In an attempt to solve the above problem, there is adopted, in the analog type apparatus of FIGS. 2 and 3, a method of selectively setting a high clock frequency and increasing the number of stages of delay means such as BBDs.

Meanwhile in the digital type apparatus of FIGS. 4 to 6, there is adopted a method of setting a high sampling frequency or enhancing the resolution of both the A-D converter and the D-A converter. Particularly in the case of employing an oversampling A-D converter, it is customary to adopt a method which reduces any noise in the band by setting a high sampling frequency and enhancing the resolution of the A-D converter.

However, in either the analog or digital type, it becomes necessary to increase the number of stages of delay means and to enlarge the scale thereof for setting a long delay time by any of the methods mentioned above.

For example, relative to the required frequency band $f_B$, the sampling frequency fs needs to satisfy the following condition on the basis of the sampling theorem.

$$f_s > 2 \cdot f_b \quad (1)$$

And there exists the following relationship between the delay time $\tau$ per stage of the delay means and the sampling frequency $f_s$.

$$\tau = 1/f_s \quad (2)$$

Therefore, in relation also to the required delay time T, the number n of required stages of the delay means is expressed as $$n = T/\tau = T f_B > 2T f_s \quad (3)$$

For example, under the conditions of $f_B$=20 (kHz) and T=100 (msec), $$n > 4000 \quad (4)$$

If each of the A-D converter and the D-A converter has a 16-bit resolution, the required capacity N of the memory is expressed as $$N > 4000 \cdot 16 = 64000 \text{ (bits)} \quad (5)$$

Even in the case of using an oversampling A-D converter, it becomes necessary to employ a memory of a great capacity substantially equivalent to the above.

Consequently, for satisfying the requirements relative to the signal frequency band, the S/N and the echo time in the conventional echo generating apparatus of the prior art, there exists a problem of increase in the production cost of the system.

If the delay time T is shortened and the gain of the feedback to the calculator is set to a great value, a long echo time may be achieved in the cyclic circuit configuration of FIG. 2 or 4. Practically, however, the following problems are raised if the delay time T is shortened in excess.

(1) The sound quality is distorted like flutter echo which is difficult to hear.

(2) The operation is rendered unstable, including that oscillation is caused even by a slight variation of the feedback gain.

Accordingly, it becomes impossible to set a sufficiently high sampling frequency $f_s$. Since the band of the filter 2 needs to be longer than half the sampling frequency $f_s$, the band width of the output signal is rendered narrow to eventually fail in attaining auditory satisfaction.

FIGS. 7 to 9 show some more conventional echo generating apparatus of the related art.

In the conventional example of FIG. 7, an audio signal received from an input terminal 61 is processed via a mixer 62, a filter 63, a bucket brigade device (BDD) 67 serving as an analog delay element, and a filter 64, and then is delivered from an output terminal 65. Simultaneously the output of the filter 64 is fed back to the mixer 62 via a feedback gain control resistor 66, whereby reverberative echo effect is added to the input audio signal.

The BBD 67 is driven by a clock signal obtained from a clock generator 68, so as to delay the input audio signal.

In the next conventional echo generating apparatus of FIG. 8, an audio signal received from an input terminal 71 is supplied via a filter 73 to an A-D converter 74 so as to be digitized, and the resultant digital signal is converted to an analog signal by a D-A converter 76 after being delayed by a memory circuit 75. The analog signal thus obtained is delivered from an output terminal 80 via a filter 79, while the output of the filter 79 is fed back to a mixer 72 via a feedback gain control resistor 81, whereby reverberative echo effect is added to the input audio signal.

Timing control is executed by a timing circuit 78 for each of the A-D converter 74, the memory circuit 75 and the D-A converter 76.

Another conventional echo generating apparatus of FIG. 9 is substantially the same in fundamental configuration as the above-described example of FIG. 8. As shown, this apparatus comprises an amplifier 104, a mixer 92, a filter 93, an A-D converter 94, a memory circuit 95, a D-A converter 96, a filter 99 and a buffer amplifier 105. The entire circuit blocks are constituted by the CMOS process and are so integrated as to form a single chip.

In this conventional example, the output of the filter 99 is fed back to the mixer 92 via an external feedback gain control resistor 103 and an input terminal 106 so as to be mixed by a mixer 101 with the input audio signal delivered via the buffer amplifier 105 and the output terminal 109, and then the mixed signal is delivered from an output terminal 110.

However, in the conventional example of FIG. 7 where the BBD needs to be manufactured in the form of an individual chip, a great number of chips are required to constitute the entire apparatus and, due to the necessity of many external elements to be connected to the apparatus, some problems are unavoidable including difficulties in reducing the occupied area and curtailing the production cost. Furthermore, since the amplitude of the analog signal transmitted through the BBD is generally smaller than the amplitude of the clock signal, the S/N is prone to be lowered by the clock noise.

Also in the next conventional example of FIG. 8, the same problems as the above are existent since the A-D converter, the memory circuit and the D-A converter are formed normally in individual chips.

Although such problems may be solved in the last conventional example of FIG. 9 where the component circuits are formed into a single chip, another problem still remains unsolved that, as the input and output characteristics of the A-D converter and the D-A converter are generally dependent upon the supply voltage, some variations in the gain, the dynamic range and the S/N occur due to the variations in the supply voltage.

OBJECTS AND SUMMARY OF THE INVENTION

It is a first object of the present invention to provide an improved echo generating apparatus wherein a long reverberative echo time can be maintained and the frequency band of the output signal can be widened without the necessity of increasing the number of stages of a signal delay means or enlarging the scale thereof.

And a second object of the present invention resides in providing an improved echo generating apparatus which is free from spurious radiation caused by a clock signal of a great amplitude, deterioration of the S/N in the data signal, and characteristic variations derived from supply voltage variations, wherein the number of component elements can be minimized to consequently reduce the occupied area as well as to curtail the production cost.

According to one aspect of the present invention, there is provided an echo generating apparatus which comprises an echo effect generating means for producing reverberative echo effect by delaying an input signal, a band limiting means for limiting the frequency band of the output signal of the echo effect generating means, and a first calculating means for delivering an output signal by calculating the input signal and the output signal of the band limiting means.

According to another aspect of the present invention, there is provided an echo generating apparatus which further comprises, in addition to the above, a frequency characteristic compensating means having such frequency characteristic as to emphasize the signal of the frequency band attenuated by the band limiting means, wherein the input signal is supplied via the frequency characteristic compensating means to the calculating means.

The echo effect generating means consists of a second calculating means for calculating the input signal and the output signal of the band limiting means, an analog delay means for delaying the output signal of the second calculating means, and a clock generating means for generating a clock signal for the operation of the analog delay means.

The first calculating means calculates at least the output signal of the band limiting means or that of the second calculating means and the output signal of the frequency characteristic compensating means.

The above and other features and advantages of the present invention will become apparent from the following description which will be given with reference to the illustrative accompanying drawings.

DESCRIPTION OF THE PREFERRED EMBODIMENTS

Hereinafter a first embodiment of the present invention will be described in detail with reference to the accompanying drawings.

Figure 1:
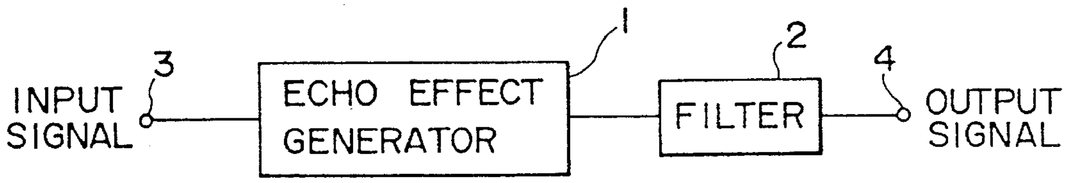
FIG. 1 PRIOR ART
FIG. 1 is a block diagram showing the fundamental constitution of an exemplary conventional echo generating apparatus of the related art.
Figure 2:
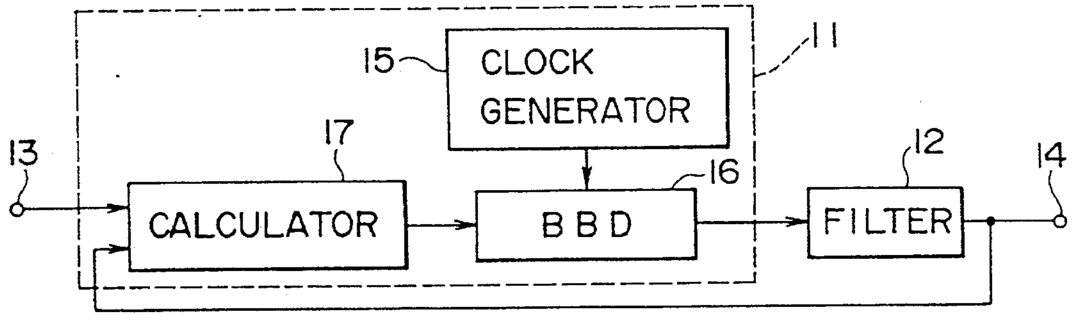
FIG. 2 PRIOR ART
FIG. 2 is a block diagram of a 1st conventional example of an analog type echo generating apparatus.
Figure 3:
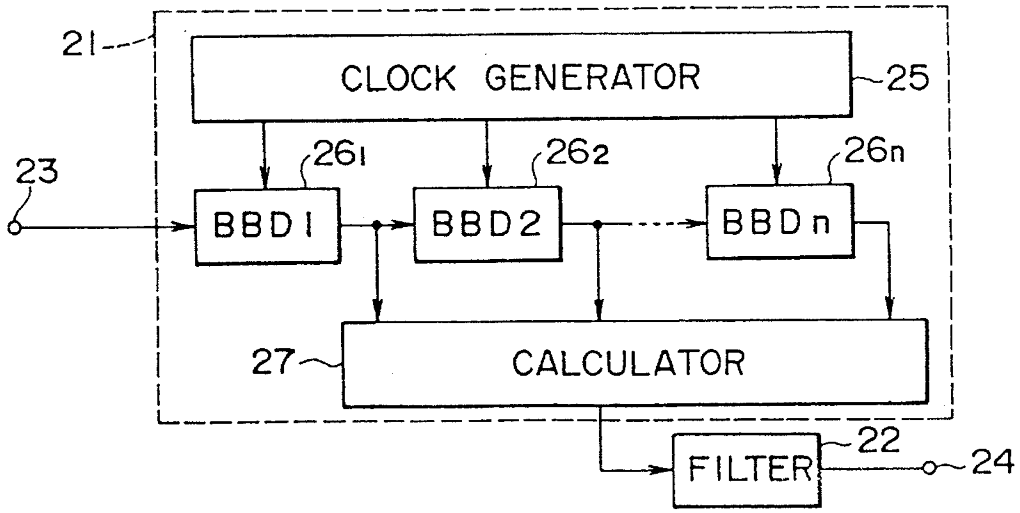
FIG. 3 PRIOR ART
FIG. 3 is a block diagram of a 2nd conventional example of an analog type echo generating apparatus.
Figure 4:
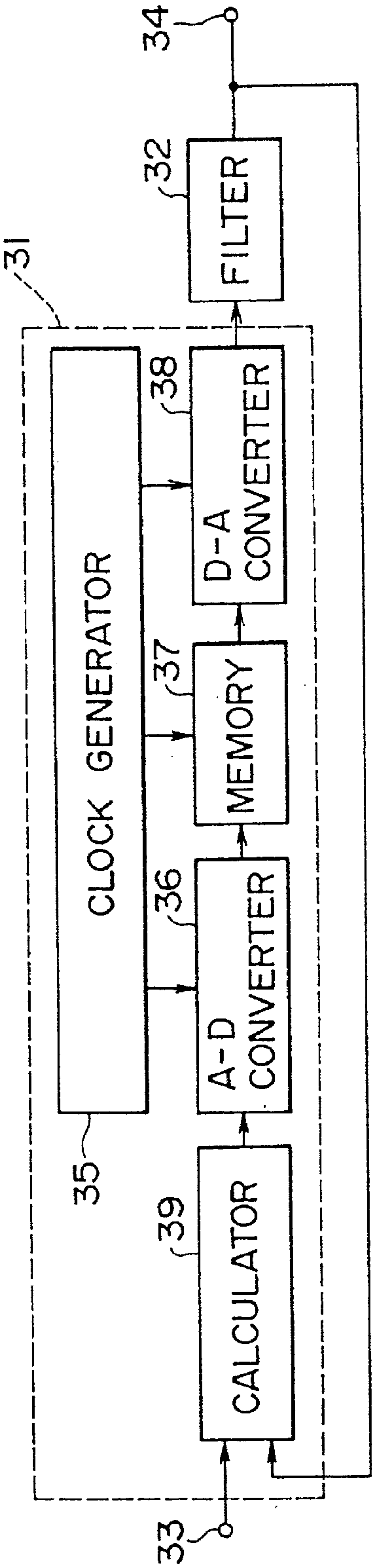
FIG. 4 PRIOR ART
FIG. 4 is a block diagram of a 3rd conventional example of a digital type echo generating apparatus.
Figure 5:
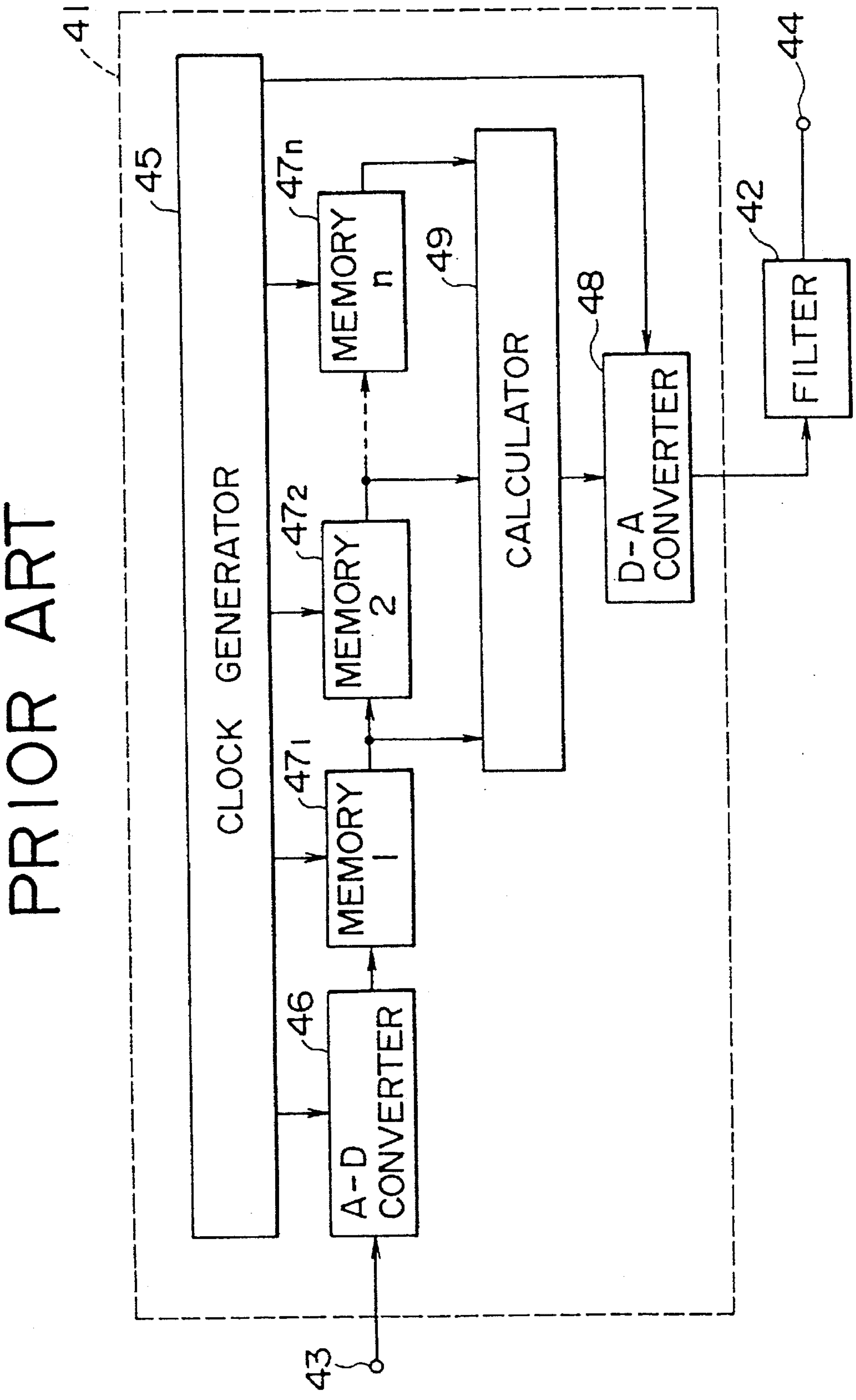
FIG. 5 PRIOR ART
FIG. 5 is a block diagram of a 4th conventional example of a digital type echo generating apparatus.
Figure 6:
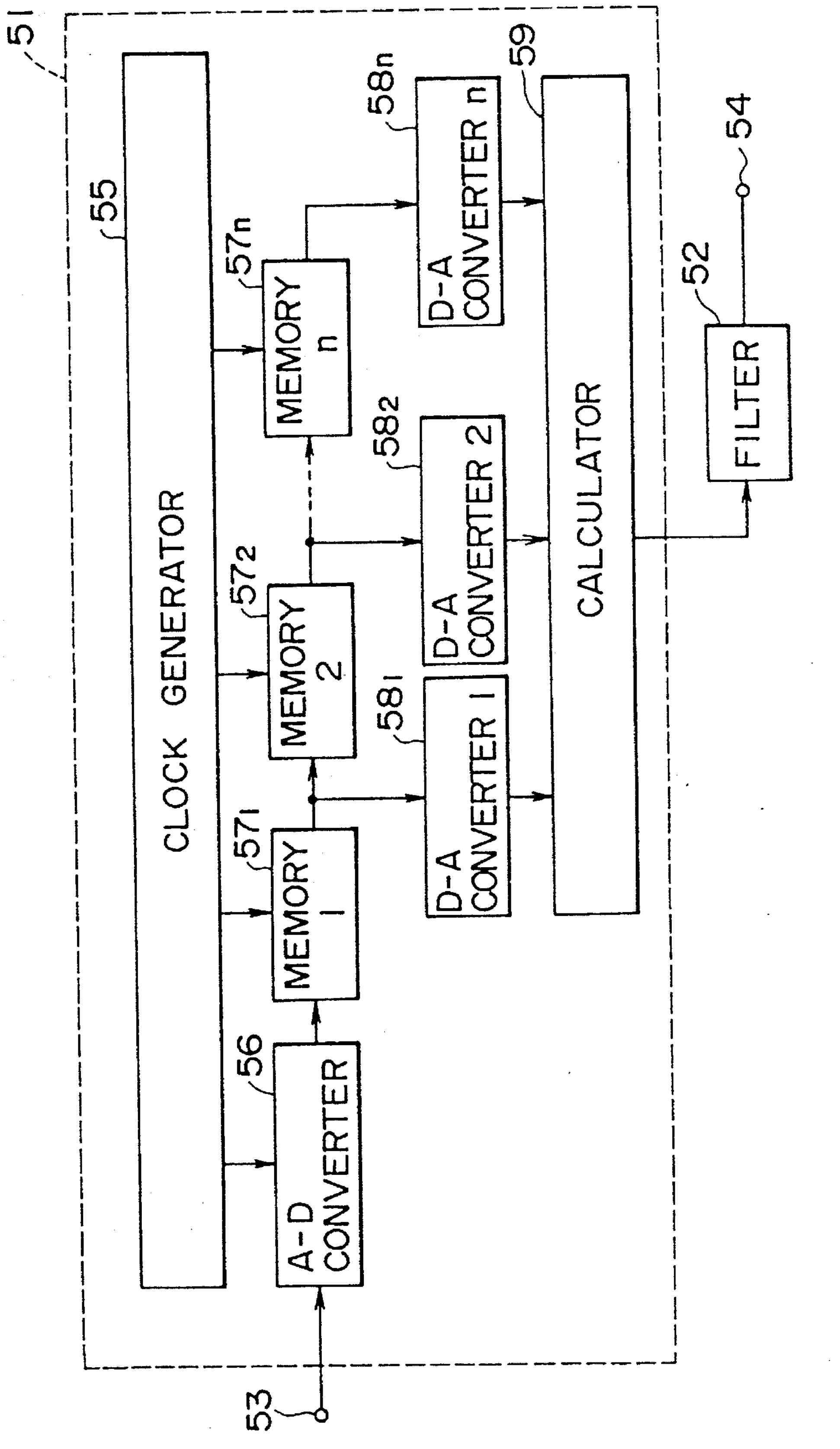
FIG. 6 PRIOR ART
FIG. 6 is a block diagram of a 5th conventional example of a digital type echo generating apparatus.
Figure 7:
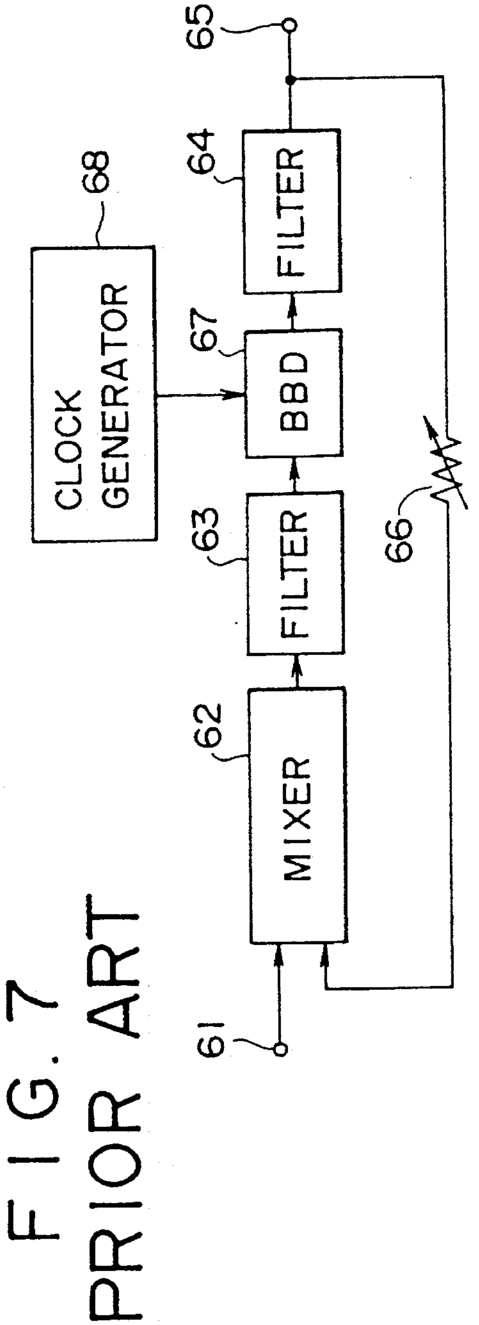
FIG. 7 PRIOR ART
FIG. 7 is a block diagram of a 6th conventional example of a feedback type echo generating apparatus.
Figure 8:
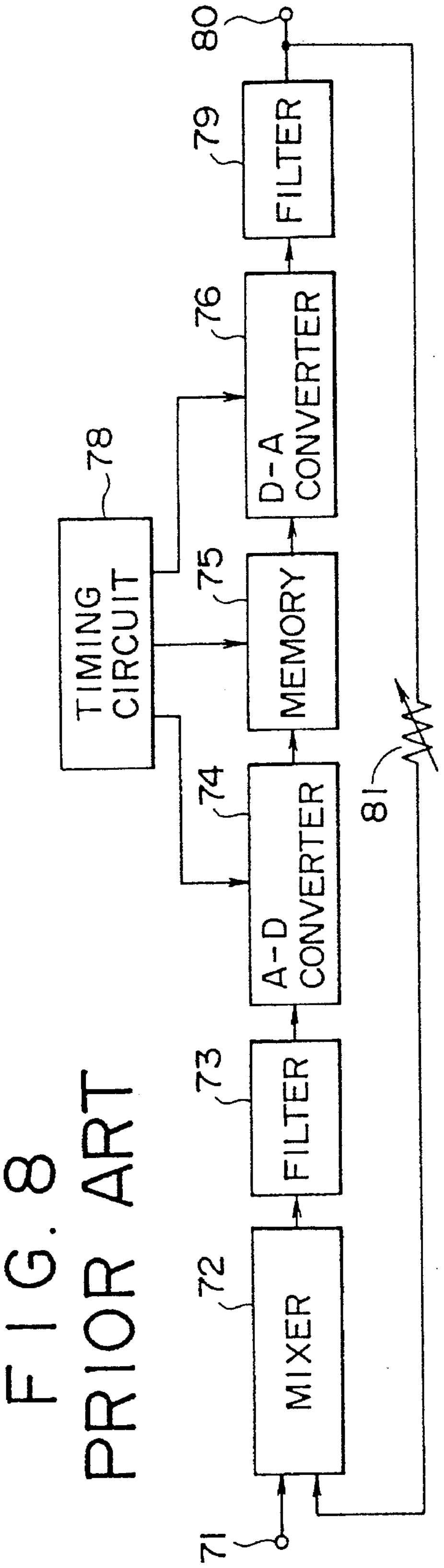
FIG. 8 PRIOR ART
FIG. 8 is a block diagram of a 7th conventional example of a feedback type echo generating apparatus.
Figure 9:
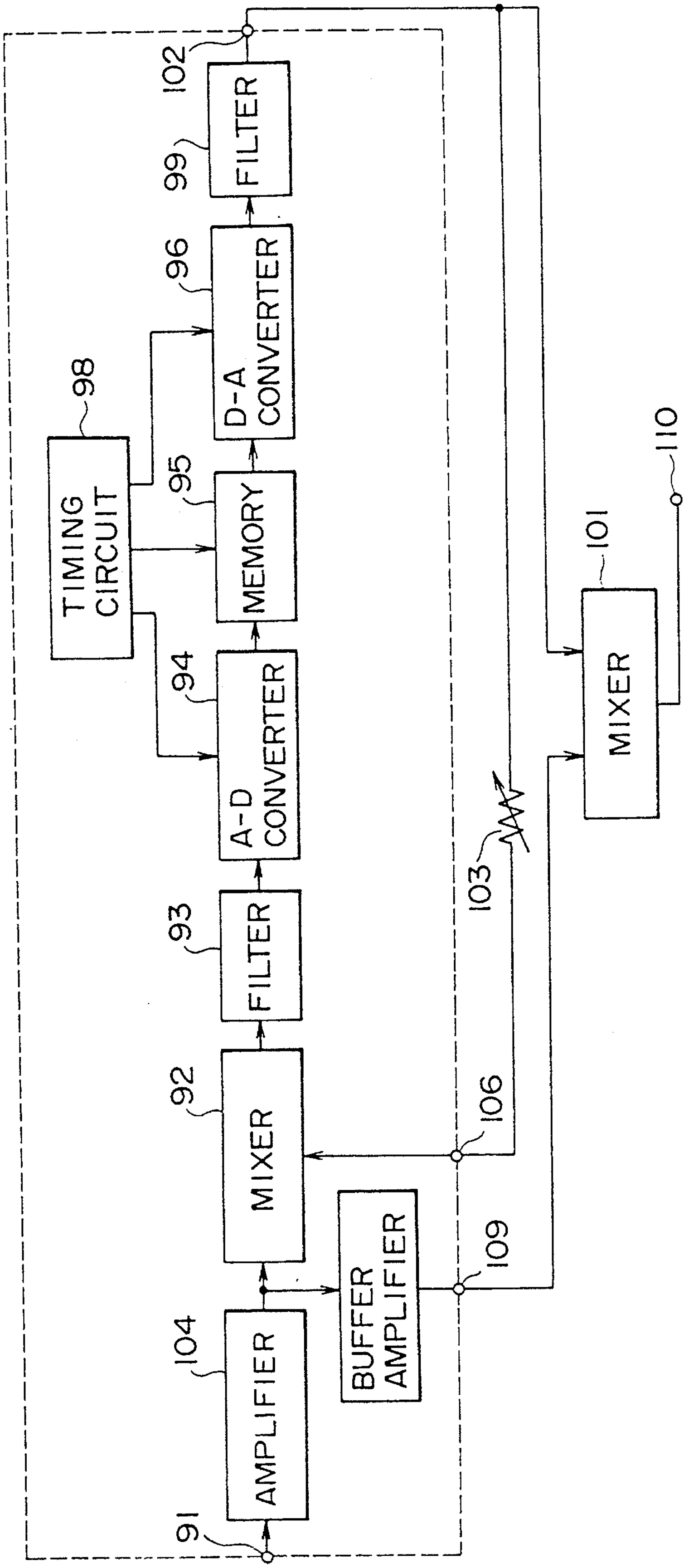
FIG. 9 PRIOR ART
FIG. 9 is a block diagram of an 8th conventional example of a feedback type echo generating apparatus.
Figure 10:
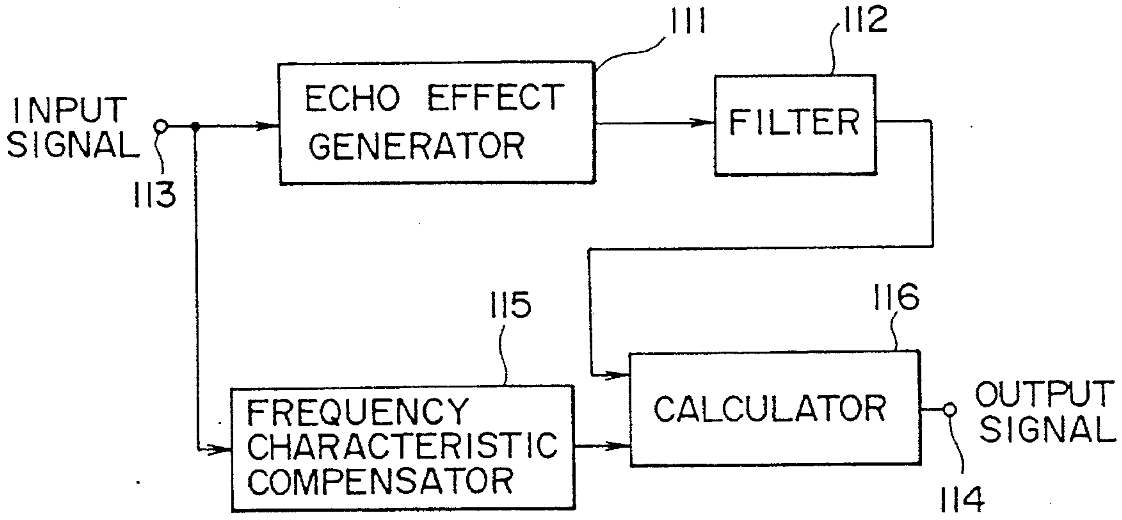
FIG. 10 is a block diagram showing the fundamental constitution of a 1st embodiment representing the echo generating apparatus of the present invention.

FIG. 10 is a block diagram showing the fundamental constitution of the echo generating apparatus according to the present invention.

In this diagram, an input signal (e.g., audio signal) received at an input terminal 113 is supplied to an echo effect generator 111 and a frequency characteristic compensator 115. A filter 112 is disposed in a stage posterior to the echo effect generator 111 and serves to attenuate any noise or unrequired frequency component included in the output signal of the echo effect generator 111.

The output signal of the filter 112 and that of the frequency characteristic compensator 115 are supplied to a calculator 116, where addition or subtraction of such signals is executed. And then the output signal of the calculator 116 is delivered via an output terminal 114.

In such constitution mentioned, the echo effect generator 111 generates a group of signals delayed from the input signal by an electronic means, and subsequently reverberative echo effect is obtained by adding the signals.

A typical means known for realizing such delay of signals is a bucket brigade device (BDD) or a charge coupled device (CCD) which produces delay effect by sampling and transmitting an analog value, or is based on a method which samples and quantizes a digital signal by an A-D converter, then delays the digital signal by a memory circuit, and regains the former analog signal by a D-A converter.

The means for generating a group of signals delayed from the input signal is constituted generally by a cyclic type which feeds back the delayed signals to the input; or a transversal type which has a plurality of center taps in its delay means and, after multiplying the output signals of the center taps by an adequate coefficient, executes addition or subtraction of the values obtained; or by a combination of such two types.

The filter 112 eliminates or attenuates any unrequited frequency component included in the output signal of the echo effect generator 111. In general the echo effect generator 111 comprises a BBD, a CCD or an A-D converter, a memory circuit and a D-A converter, so that its output signal includes a clock-frequency component and higher harmonics thereof, and also quantization noise. Therefore, the amplitude of the clock-frequency component and the quantization noise included in the output signal of the echo effect generator 111 can be reduced effectively by limiting the frequency band through the filter 112.

Particularly when an oversampling A-D converter is used in the echo effect generator 111, the spectrum of the quantization noise indicates such characteristic that the noise component increases in a higher frequency range, so that attenuation of the higher frequency component through the filter 112 is remarkably effective for reducing the noise voltage at the output terminal 114. In this case, however, it follows that the frequency component included in the output signal is also attenuated simultaneously by the filter 112.

The frequency characteristic compensator 115 employed in this embodiment has such frequency characteristic as to emphasize the signal of the frequency band attenuated by the filter 112. When the frequency characteristic of the filter 112 indicates a low-pass filter characteristic curve shown in FIG. 11(*a*) for example, the frequency characteristic of the compensator 115 is so set as to indicate a higher-range emphasis characteristic curve shown in FIG. 11(*b*).

Figure 11:
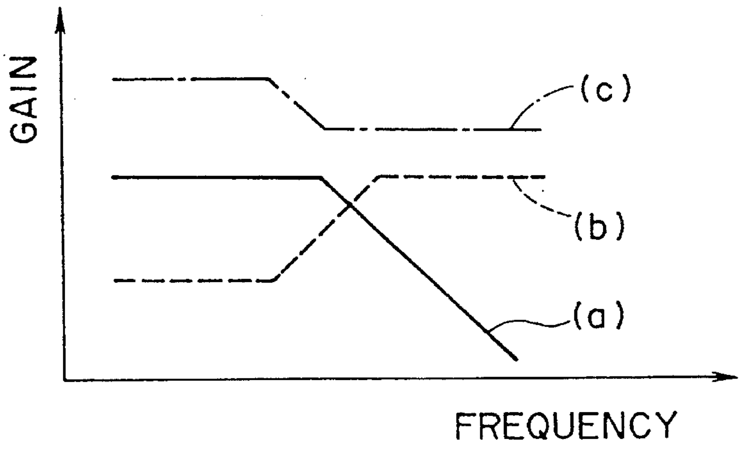
FIG. 11 graphically shows the frequency characteristics of a filter and a frequency characteristic compensator employed in the apparatus of FIG. 10.

Relative to the frequency characteristic of the compensator 115, the reason for selecting the gain characteristic as shown at (*b*) in FIG. 11 in place of a high-pass filter characteristic is based on the purpose of adding the input signal itself with flat frequency characteristic to thereby add direct sound instead of any reflected or reverberated sound, hence eliminating auditory unnaturalness.

The calculator 116 executes addition or subtraction of the output signals of the filter 112 and the frequency characteristic compensator 115 at an adequate rate.

When the output signal of the filter 112 has the frequency characteristic of FIG. 11(*a*) for example and the output signal of the frequency characteristic compensator 115 has the characteristic of FIG. 11(*b*), the frequency characteristic of the output signal of the calculator 116 obtained from the output terminal 114 can be rendered much flatter than that of the output signal of the filter 112, as indicated by the curve of FIG. 11(*c*).

Thus, auditorily natural reverberated sound can be realized by further flattening the frequency characteristic of the output signal.

In case the filter 112 employed is a low-pass filter, even if the cutoff frequency thereof is lowered down to 500 Hz or so, it is still possible to achieve auditorily natural reverberated sound by setting the frequency characteristic of the compensator 115 to an adequate curve and the addition rate of the calculator 116 to an adequate value, respectively. Since the required signal frequency $f_B$ is 500 Hz in this case, the number n of stages of the delay means becomes greater than 100 according to Eq. (3).

And when each of the A-D converter and the D-A converter has a 16-bit resolution, the memory capacity N is greater than 1600 bits, so that the scale of the signal delay means can be widely reduced in comparison with the conventional example of the related art where N>64000 bits. And the sampling frequency is settable to a lower value even if the number of stages of the delay means is left unchanged.

As described, the signal component in the band attenuated through the filter 112 is compensated by the frequency characteristic compensator 115, so that the frequency band of the output signal can be widened.

Furthermore, since the frequency band of the output signal is not narrowed despite narrowing the pass band of the filter 112, the sampling frequency of the signal delay means is settable to a lower value even in case of using the same number of the delay stages, whereby the reverberation time of the output signal can be extended while maintaining stability.

In addition, it is also possible to set the sampling frequency of the signal delay means to a lower value while ensuring the equivalent S/N and frequency characteristic, hence minimizing the number of stages of the signal delay means and reducing the scale thereof with retention of the equivalent delay time to consequently attain curtailment of the production cost. Particularly when the component elements are assembled into an IC configuration, the effect of the cost curtailment due to reduction of the chip area is remarkably great.

In case the signal delay means is of a digital type, the sampling frequency is settable to a further lower value, so that the design of the A-D converter and the D-A converter can be facilitated, and a proper operation is ensured even if the operation speed of logic circuits inclusive of the memory circuit is low. Consequently it becomes possible to extend the lower limit of the operating voltage range.

Meanwhile in case the signal delay means is of an analog type, the number of required delay stages is smaller to eventually improve the distortion factor of the output signal.

Figure 12:
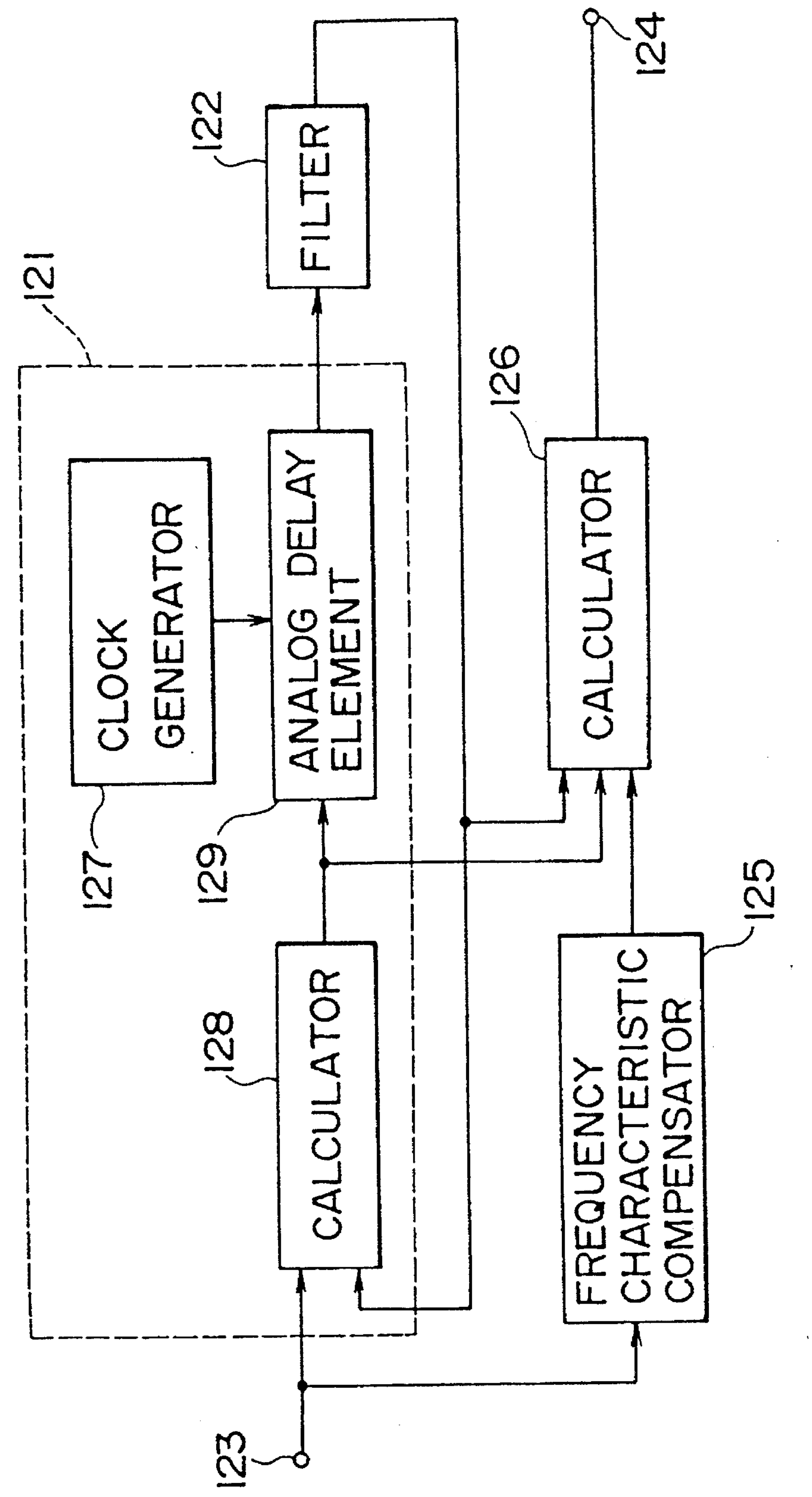
FIG. 12 is a block diagram of a 2nd embodiment representing the echo generating apparatus of the invention.

Hereinafter a 2nd embodiment of the present invention will be described in detail with reference to a block diagram thereof shown in FIG. 12.

In the 2nd embodiment, a cyclic echo effect generator 121 is constituted by employing, as a signal delay means, an analog delay element 129 such as a BBD. In the cyclic circuit configuration, an input signal is supplied via a calculator 128 to the analog delay element 129 so as to be delayed, and the signal is fed back to the calculator 128 after the band is limited through a filter 122.

In this circuit configuration, the output signals of the filter 122 and the calculator 128 are furnished with reverberative echo effect and are supplied to a calculator 126 so as to be added to or subtracted from, at a predetermined rate, the input signal processed through a frequency characteristic compensator 125 in such a manner that the higher range of the frequency characteristic is compensated.

In the 2nd embodiment mentioned, the output signals of both the filter 122 and the calculator 128 are added to or subtracted from the output signal of the frequency characteristic compensator 128. However, the circuit configuration may be so modified as to execute addition or subtraction of merely one of such two output signals and the output signal of the frequency characteristic compensator 125.

Figure 13:
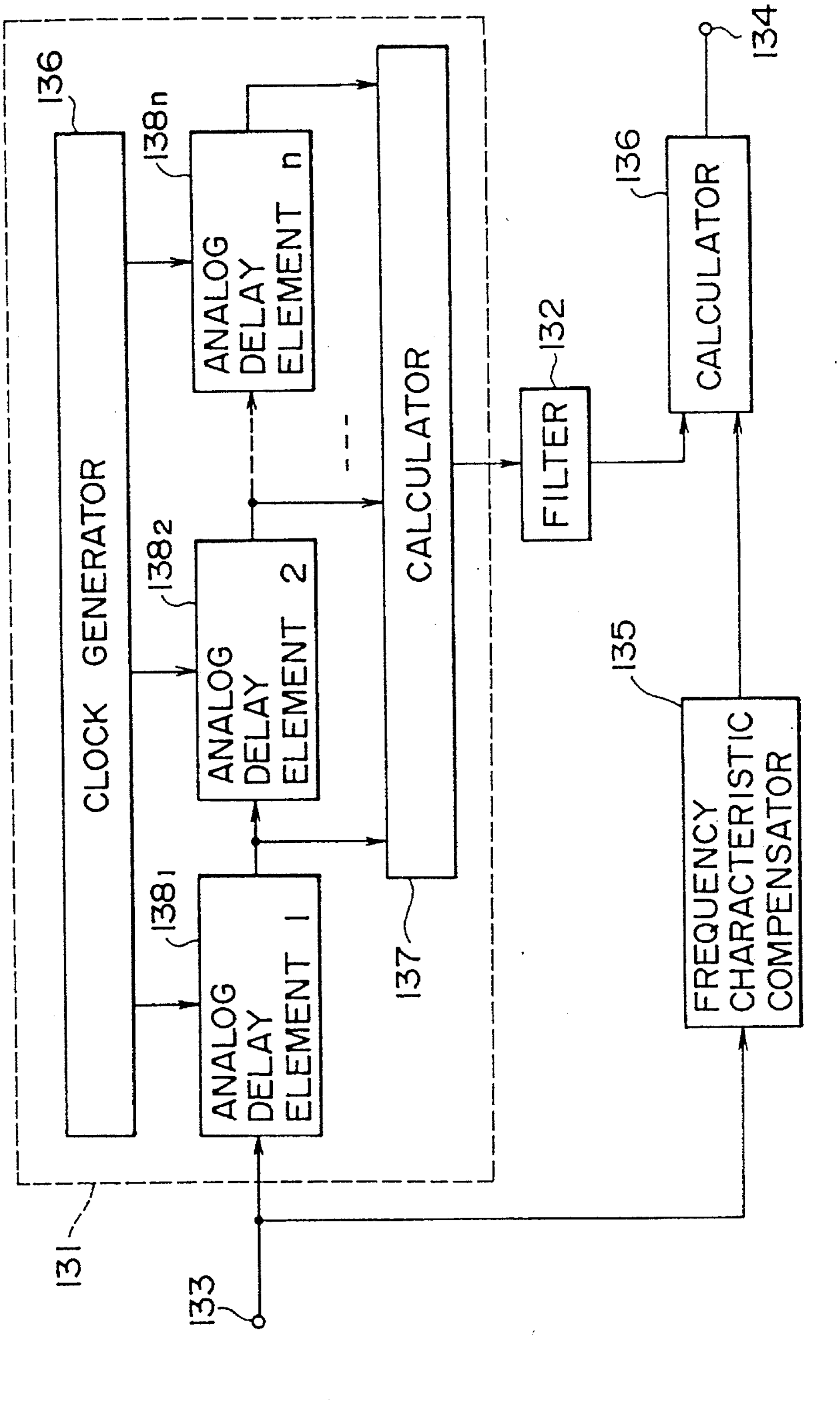
FIG. 13 is a block diagram of a 3rd embodiment representing the echo generating apparatus of the invention.

FIG. 13 is a block diagram showing a 3rd embodiment of the present invention.

In the 3rd embodiment, there is incorporated a transversal echo effect generator 131 wherein n stages of analog delay elements $138_1$–$138_n$ consisting of BBDs or the like are used as signal delay means, and the output signals of the analog delay elements $138_1$–$138_n$ are added or subtracted at a predetermined rate in a calculator 137, whereby a signal with reverberative echo effect is outputted from a filter 132.

The calculator 137 may be so modified as to execute addition or subtraction at a predetermined rate after multiplying each of the output signals of the analog delay elements $138_1$–$138_n$ by adequate coefficients 501, whereby desired echo effect can be obtained selectively.

Figure 14:
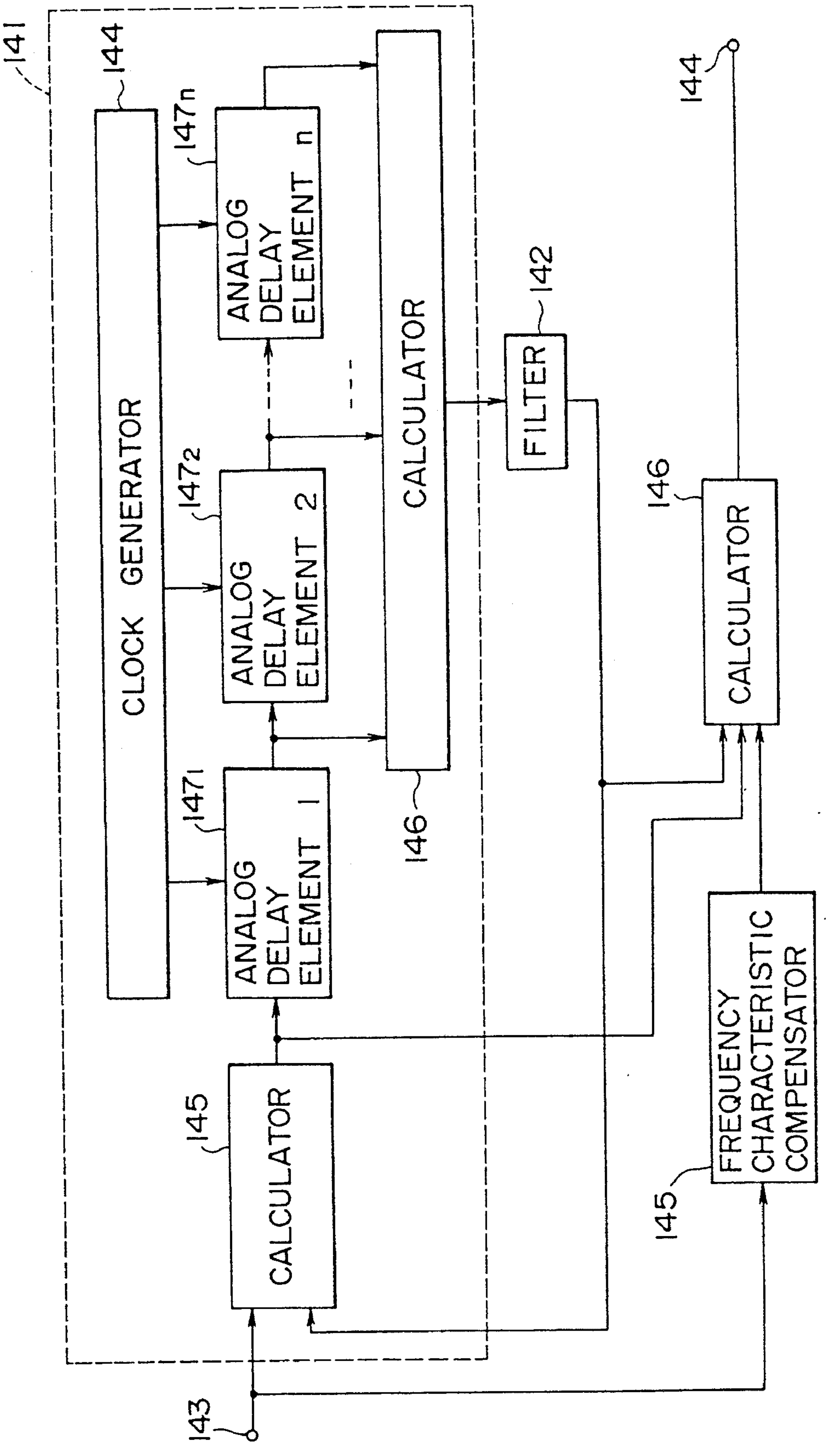
FIG. 14 is a block diagram of a 4th embodiment representing the echo generating apparatus of the invention.

FIG. 14 is a block diagram showing a 4th embodiment of the present invention.

In the 4th embodiment, an echo effect generator is constituted by combining the cyclic 2nd embodiment with the transversal 3rd embodiment.

In the circuit configuration of the 4th embodiment, the respective output signals of a filter 142 and a calculator 145 are furnished with reverberative echo effect, and one or both of such signals are outputted after being added to or subtracted from the output signal of a frequency characteristic compensator 145 at a predetermined rate.

In this embodiment also, similarly to the preceding case of the 3rd embodiment, each of the output signals of the analog delay elements $147_1$–$147_n$ is multiplied by predetermined coefficients 502 and then is added or subtracted as mentioned, so that desired reverberative echo effect can be achieved selectively.

Figure 15:
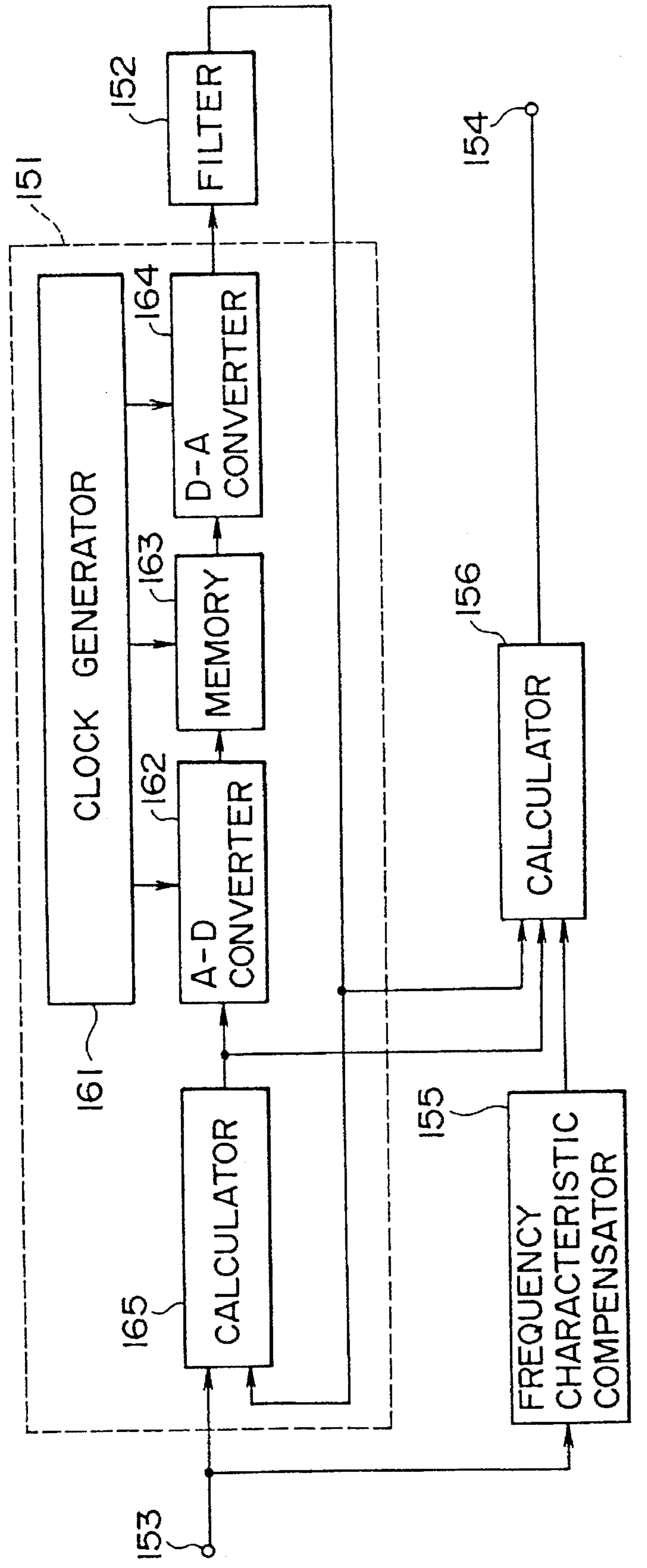
FIG. 15 is a block diagram of a 5th embodiment representing the echo generating apparatus of the invention.

FIG. 15 is a block diagram showing a 5th embodiment of the present invention.

In the 5th embodiment, a cyclic echo effect generator 151 is constituted by employing an A-D converter 162, a memory circuit 163 and a D-A converter 164 as signal delay means. An input signal processed by a calculator 165 is digitized by the A-D converter 162 and, after being delayed by the memory circuit 163, the signal is converted into an analog form by the D-A converter 164 and then is fed back via a filter 152 to the calculator 165.

In this circuit configuration, the output signals of both the filter 152 and the calculator 165 are furnished with reverberative echo effect and then are delivered after being added to or subtracted from the output signal of a frequency characteristic compensator 155 at a predetermined rate.

In the 5th embodiment, the output signals of both the filter 152 and the calculator 165 are added to or subtracted from the output signal of the frequency characteristic compensator 155. However, the circuit configuration may be so modified as to execute addition or subtraction of merely one of such two output signals and the output signal of the frequency characteristic compensator 155.

Figure 16:
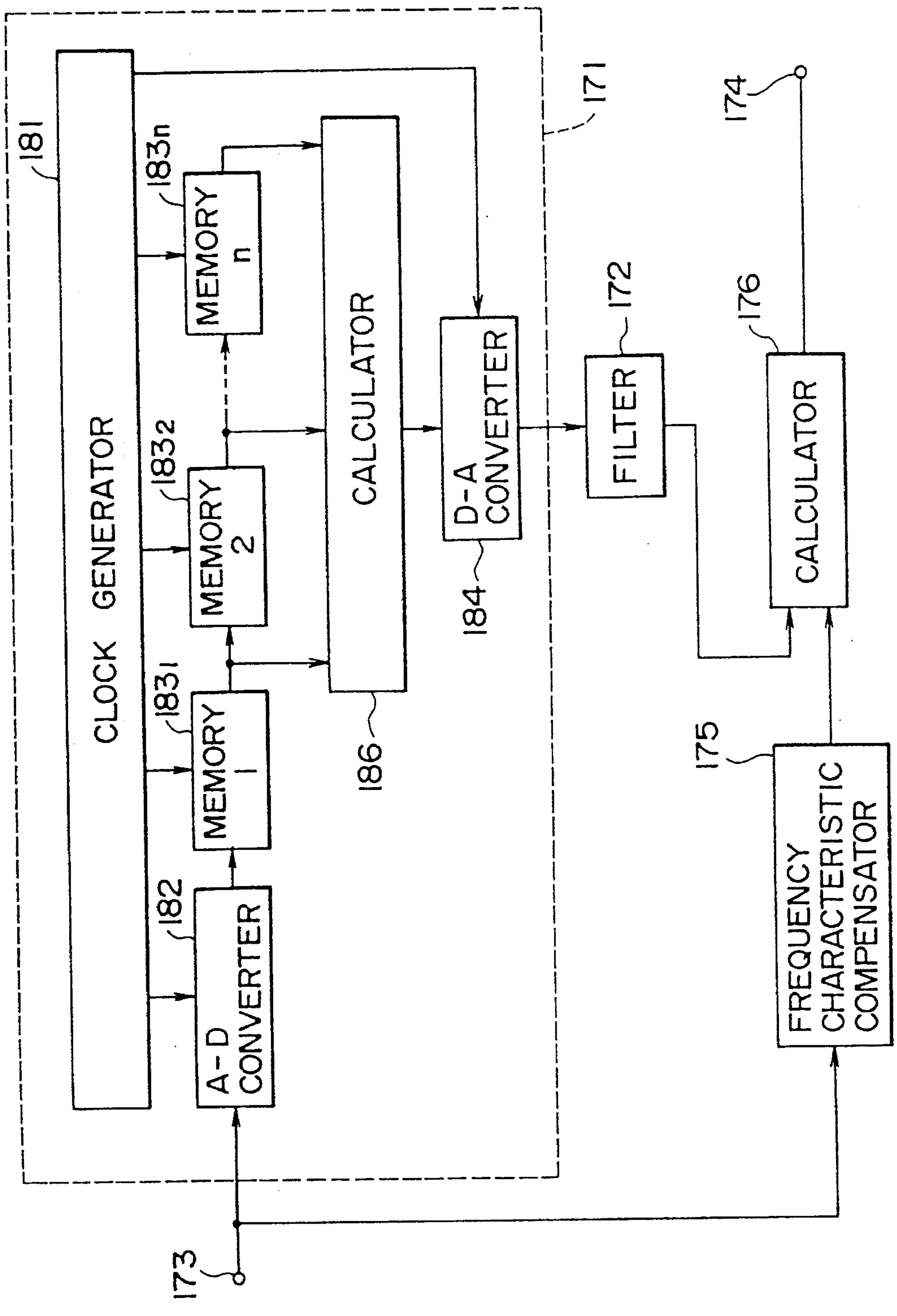
FIG. 16 is a block diagram of a 6th embodiment representing the echo generating apparatus of the invention.

FIG. 16 is a block diagram showing a 6th embodiment of the present invention.

The 6th embodiment incorporates a transversal echo effect generator 171 comprising n-stage memory circuits $183_1$–$183_n$, wherein the output signals of such memory circuits $183_1$–$183_n$ are added or subtracted by a calculator 126 at a predetermined rate, so that the signal with reverberative echo effect is outputted from a filter 172.

The calculator 186 may be so modified as to execute addition or subtraction at predetermined rate after multiplying each of the output signals of the memory circuits $183_1$–$183_n$ by a predetermined coefficients 503, whereby desired reverberative echo effect can be obtained selectively.

In the above 6th embodiment, the output signals of the memory circuits $183_1$–$183_n$ are first calculated in the calculator 186 and then are converted into an analog form by the D-A converter 184. However, n-stage D-A converters may be employed to convert the output signals of the memory circuits $183_1$–$183_n$ respectively into an analog form, and then the analog signals may be calculated in the calculator 186.

Figure 17:
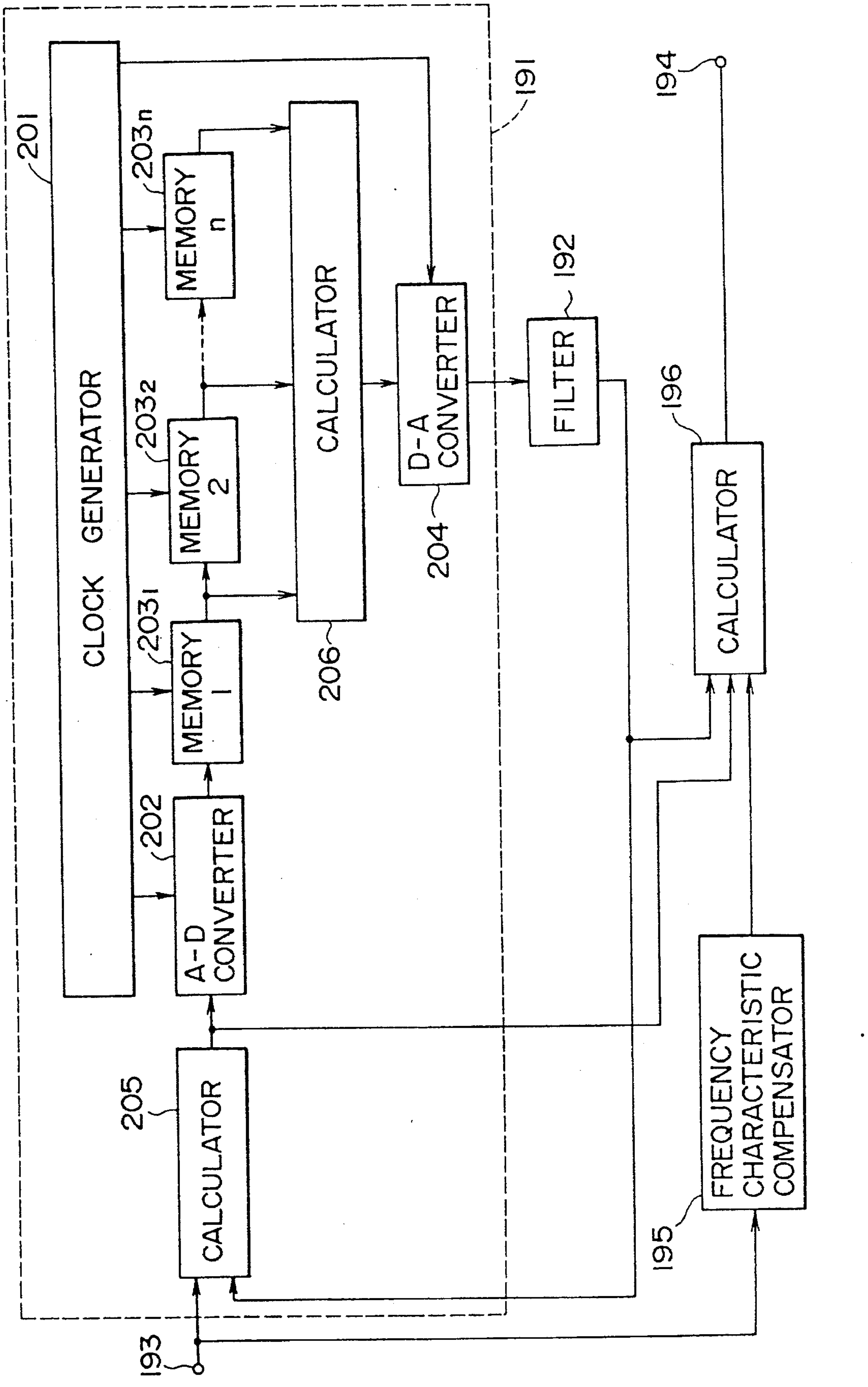
FIG. 17 is a block diagram of a 7th embodiment representing the echo generating apparatus of the invention.

FIG. 17 is a block diagram showing a 7th embodiment of the present invention.

In the 7th embodiment, an echo effect generator is constituted by combining the cyclic 5th embodiment with the transversal 6th embodiment.

In the circuit configuration of the 7th embodiment, the output signals of a filter 192 and a calculator 205 are furnished with reverberative echo effect, and one or both of such signals are delivered after being added to or subtracted from the output signal of a frequency characteristic compensator 195 at a predetermined rate.

In the 7th embodiment also, similarly to the preceding case of the 6th embodiment, desired reverberative echo effect can be obtained selectively by first multiplying each of the output signals of memory circuits $203_1$–$203_n$ by a predetermined coefficients 504 and then executing addition or subtraction thereof at a predetermined rate.

The circuit configuration may further be modified in such a manner as to change the positional order of the calculator 206 and the D-A converter so that the output signals of the memory circuits $203_1$– $203_n$ are calculated after being converted into an analog form.

Figure 18:
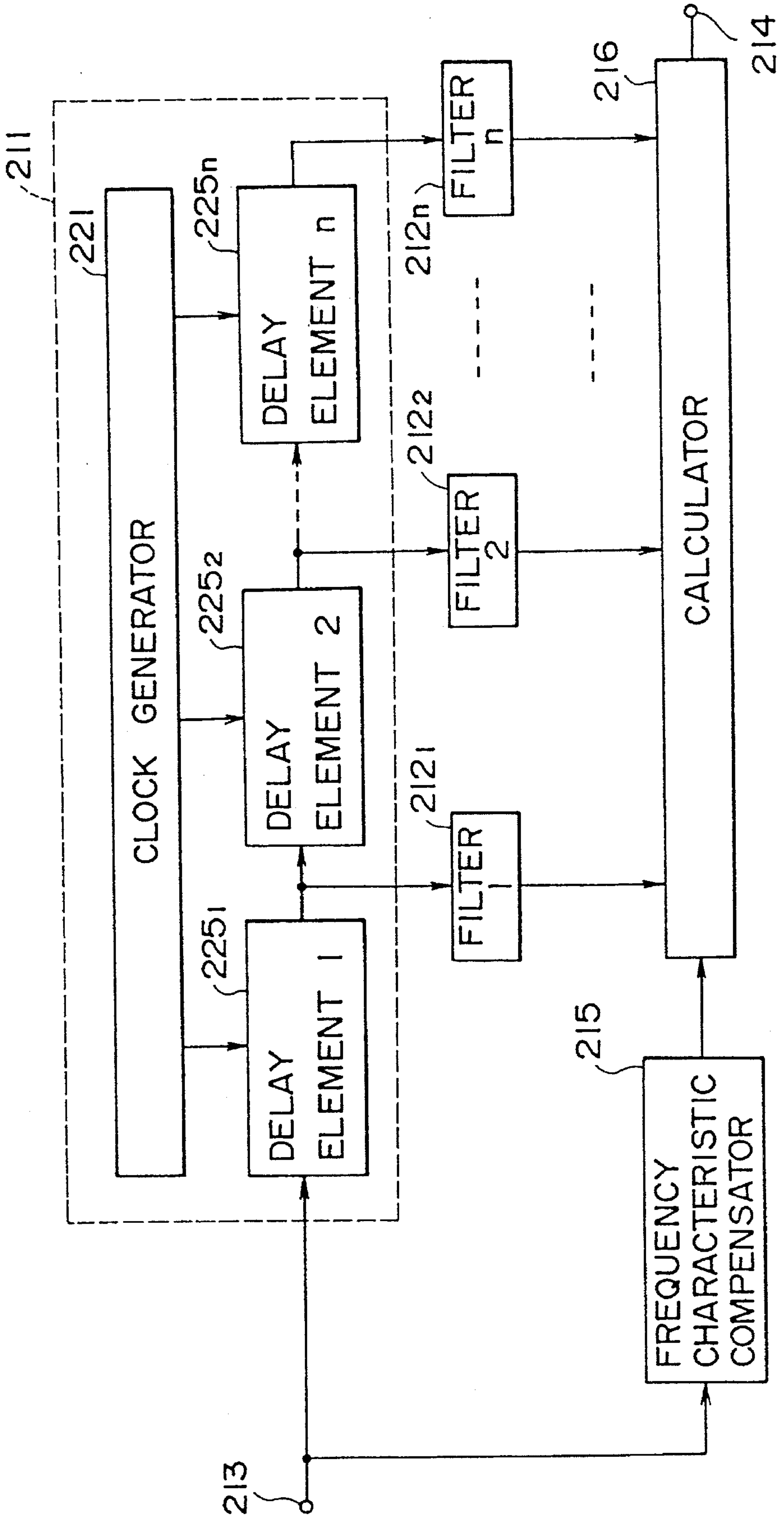
FIG. 18 is a block diagram of an 8th embodiment representing the echo generating apparatus of the invention.

FIG. 18 is a block diagram showing an 8th embodiment of the present invention.

This embodiment is a modification of the transversal 3rd embodiment shown in FIG. 13. In this configuration, output signals of n-stage delay elements $225_1$–$225_n$ are supplied to n-stage filters $212_1$–212n of which cutoff frequencies are mutually different, and after the bands are limited therethrough, the signals are added to or subtracted from the output signal of a frequency characteristic compensator 215 by a calculator 216 at a predetermined rate.

According to this circuit configuration, it becomes possible to optimize the respective characteristics of the filters $212_1$–$212_n$. When BBDs are used as delay elements $225_1$–$225_n$ for example, the noise component increases toward the rearmost stage. Therefore, the S/N of the output signal delivered from an output terminal 214 can be improved by setting the pass bands of the filters $212_1$–$212_n$ to be narrower toward the rearmost stage.

The calculator 216 may be so modified as to execute addition or subtraction at a predetermined rate after multiplying each of the output signals of the filters $212_1$–$212_n$ by a predetermined coefficient. This modification is effective for obtaining desired reverberative echo effect selectively. It is not exactly necessary to add or subtract the entire output signals of the filters $212_1$–$212_n$ to or from the output signal of the frequency characteristic compensator 215, and such addition or subtraction may be executed with regard to at least one output signal of the filters.

Figure 19:
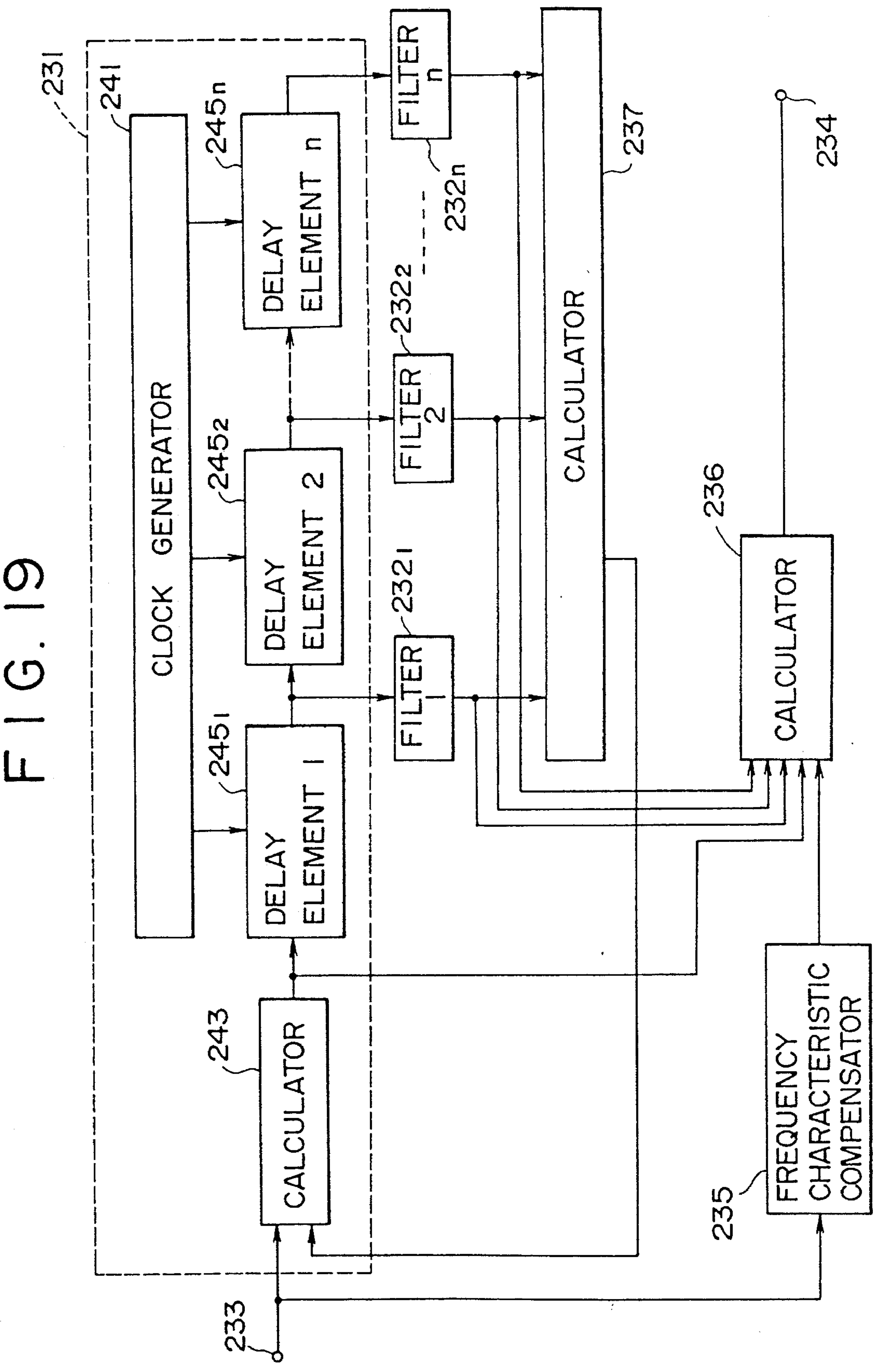
FIG. 19 is a block diagram of a 9th embodiment representing the echo generating apparatus of the invention.
Figure 20A:
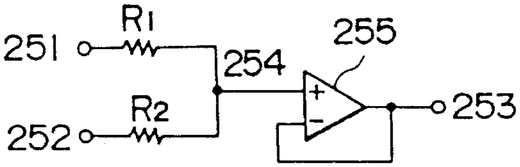
FIG. 20(*a*)–(*d*) are a circuit diagram of exemplary calculators shown as a 10th embodiment of the invention.
Figure 20B:
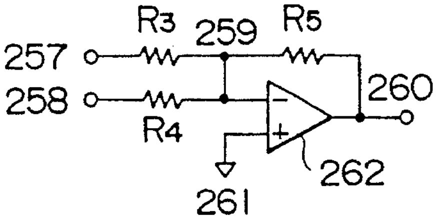
Figure 20C:
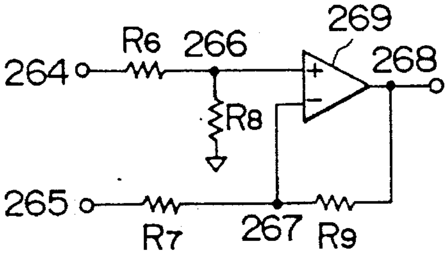
Figure 20D:
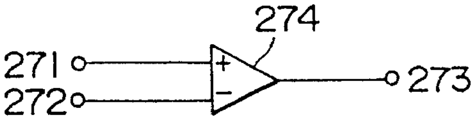

FIG. 19 is a block diagram showing a 9th embodiment of the present invention.

This embodiment is a modification of the 4th embodiment (FIG. 14) constituted by combining a cyclic type with a transversal type. The output signals of n-stage delay elements $245_1$–$245_n$ are supplied to n-stage filters $232_1$–$232_n$ of which cutoff frequencies are mutually different, and the band-limited signals obtained therefrom are added or subtracted at a predetermined rate by a calculator 237, whose output signal is then fed back to a calculator 243 so as to be calculated with the input signal. Thereafter, addition or subtraction is executed by calculator 236 with regard to the respective output signals of the filters $232_1$–$232_n$, the calculator 243 and the frequency characteristic compensator 235 at a predetermined rate, and then the result of such calculation is delivered as an output.

According to this constitution, the characteristics of the filters $232_1$–$232_n$ can be optimized as in the preceding case of the 8th embodiment. More specifically, when BBDs are used as delay elements $245_1$–$245_n$, the noise component increases toward the rearmost stage. Therefore the S/N of the output signal delivered from an output terminal 234 can be improved by setting the pass bands of the filters $232_1$–$232_n$ to be narrower toward the rearmost stage.

The calculator 237 may be so modified as to execute addition or subtraction at a predetermined rate after multiplying each of the output signals of the filters $232_1$–$232_n$ by predetermined coefficients 505, hence attaining desired reverberative echo effect selectively. It is not exactly necessary to add or subtract the entire output signals of the filters $232_1$– $232_n$ to or from the output signal of the frequency characteristic compensator 235, and such addition or subtraction may be executed with regard to at least one output signal of the filters.

FIG. 20 shows circuit diagrams of exemplary calculators as a 10th embodiment of the present invention.

In the diagrams, (a) is a noninverting adder, (b) is an inverting adder, (c) is a subtracter, and (d) is an input calculator used when an entire delay means is incorporated in a feedback loop.

Figure 21A:
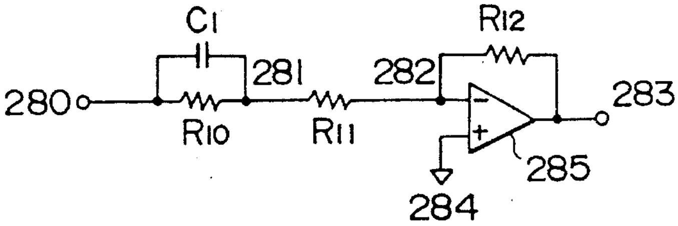
FIG. 21(*a*)–(*c*) are circuit diagrams of exemplary frequency characteristic compensator shown as an 11th embodiment of the invention.
Figure 21C:
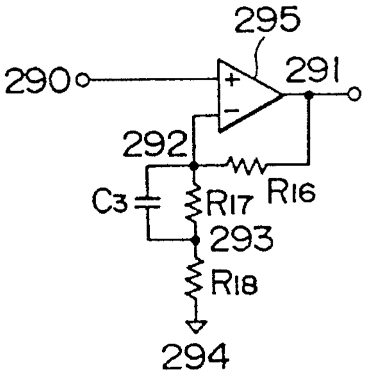
Figure 21B:
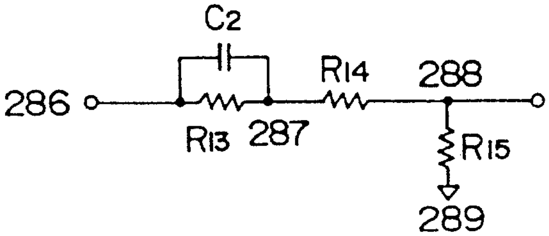

FIG. 21 shows circuit diagrams of exemplary frequency characteristic compensators as an 11th embodiment of the present invention.

In the diagrams, (a) is an inverting circuit servable also as an output calculator if the output signal current from a filter is additionally applied to the inverting input terminal of an operational amplifier, (b) is a passive circuit, and (c) is an active circuit. Each of such circuits is capable of realizing lead-lag frequency characteristic.

In the analog type or digital type echo generating apparatus, it is generally customary that a band limit filter for prevention of aliasing noise is inserted in the input of a delay element or an A-D converter. In each diagram of the embodiments mentioned, such band limiting filter is omitted.

The above embodiments represent an exemplary case where signals at the input and output terminals are in an analog form. However, it is to be understood that the present invention is applicable also to another case where the signals at the input and output terminals are in a digital form either partially or entirely.

Thus, according to the echo generating apparatus of the present invention where a band limiting means is provided posterior to an echo effect generator, which produces reverberative echo effect through a signal delay means, so as to reduce the noise component included in the output signal of the echo effect generator, the input signal is passed through a frequency characteristic compensator so that the signal component of the frequency band attenuated by the band limiting means is emphasized, and a final output signal is delivered by calculating the output signals of both the band limiting means and the frequency characteristic compensator. Consequently, it becomes possible to widen the frequency band of the output signal and to retain a long reverberation time without the necessity of increasing the number of the signal delay stages or enlarging the scale thereof.

Now a 12th embodiment of the present invention will be described in detail below with reference to the accompanying drawing.

Figure 22:
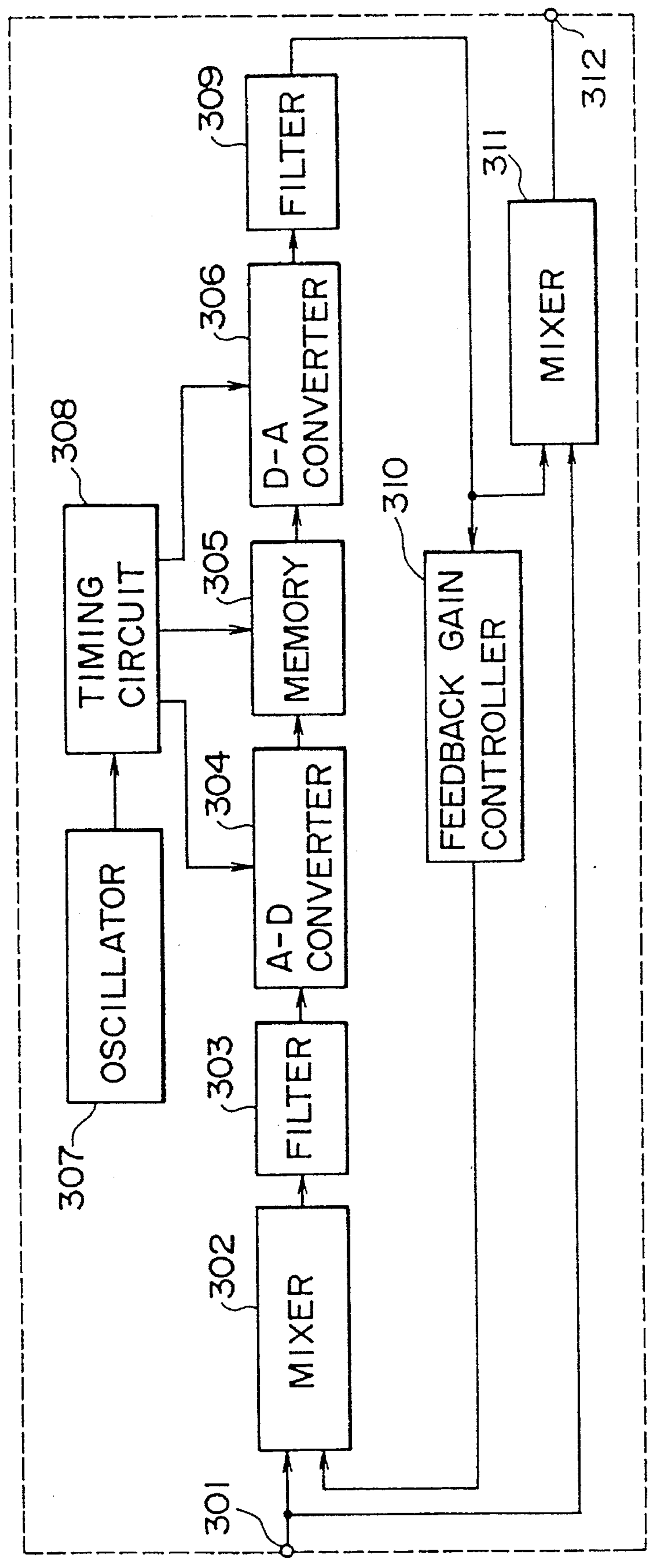
FIG. 22 is a block diagram of a 12th embodiment representing the echo generating apparatus of the invention.

FIG. 22 is a block diagram of the 12th embodiment, wherein an input audio signal received at an input terminal 301 is supplied via a mixer 302 to a filter 303 which is a high rejection type for prevention of aliasing noise relative to an A-D converter 304 disposed in the next stage.

The output signal of the filter 303 is converted into a digital signal by the A-D converter 304. Since this converter 304 usually consists of a ΔΣ type or ADM (adaptive delta modulation) type oversampling A-D converter, the sampling clock frequency thereof is normally in a high frequency range of 200 kHz to 20 MHz.

The output signal of the A-D converter 304 is sequentially transferred via a memory circuit 305 to be thereby delayed, and then is converted into an analog signal by a D-A converter 306. A timing circuit 308 generates operation clock and timing signals for the A-D converters 304, the memory circuit 305 and the D-A converter 306. The signals obtained from the timing circuit 308 are based on an original oscillation signal generated from an oscillator 307.

The output signal of the D-A converter 306 is passed through a filter 309 where the sampling clock component and the noise component are eliminated, and the signal therefrom is fed back to a mixer 302 via a feedback gain controller 310 while being mixed with the input audio signal in a mixer 311 to be thereby furnished with reverberative echo effect, and then the output audio signal thus obtained is delivered from an output terminal 312.

The gain of feedback from the filter 309 to the mixer 302 is set in the feedback gain controller 310 to thereby determine the reverberative echo depth.

According to the present invention, the memory circuit 305 and the timing circuit 308 in the echo generating apparatus of such constitution are formed by the CMOS process which is excellent in achieving low power consumption, while the other component circuits are formed by the bipolar transistor process excellent in achieving rapidity, and the entire component circuits are integrated to produce a single BiCMOS chip.

Due to the manufacture of such a single chip structure, remarkable advantages are attainable in eliminating spurious radiation derived from the clock signal of any great amplitude, preventing deterioration of the S/N, and minimizing the number of required component elements to consequently realize reduction of the occupancy area and curtailment of the production cost.

Figure 23:
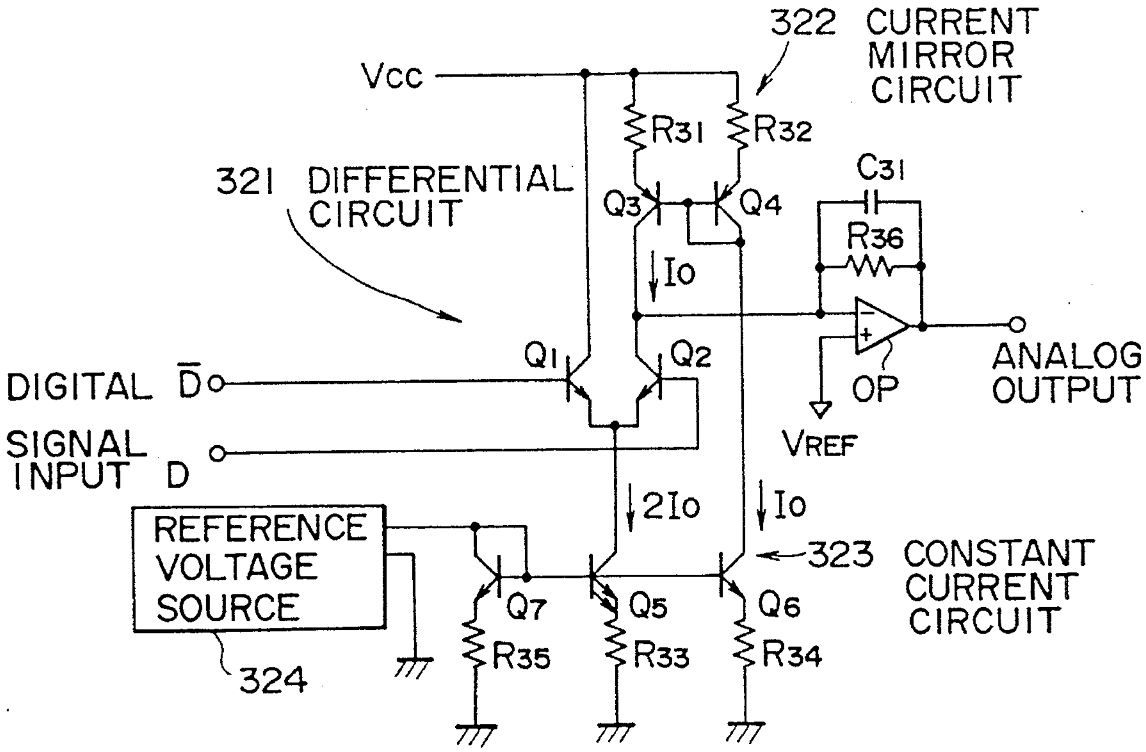
FIG. 23 is a circuit diagram of an exemplary D-A converter shown as a 13th embodiment of the invention.

FIG. 23 is a circuit diagram of a 13th embodiment representing an exemplary configuration of the D-A converter 306 shown in FIG. 22.

In FIG. 23, a differential circuit 321 constituting an input stage comprises a pair of transistors Q1, Q2 whose emitters are mutually connected, wherein a digital signal is applied between the bases of the differential transistors Q1, Q2. The collector of the transistor Q1 is connected directly to a power source Vcc, while the-collector of the transistor Q2 is connected via a transistor Q3 and a resistor R31 to the power source Vcc.

The transistor Q3 constitutes a current mirror circuit 322 in combination with the resistor R31, a diode-connection transistor Q4 and a resistor R32.

Collectors of transistors Q5, Q6 constituting a constant current circuit 323 are connected to the common node of the emitters of the differential transistors Q1, Q2 and the collector of the transistor Q4, respectively.

In the constant current circuit 323, the base of a diode-connection transistor Q7 is connected to the bases of the transistors Q5, Q6, and the collector of the transistor Q7 is connected to a reference voltage source 324. The emitters of the transistors Q5–Q7 are grounded via resistors R33–R35, respectively.

The collector current of the transistor Q5 is set to be double the collector current Io of the transistor Q3.

An inverting input terminal of an operational amplifier OP constituting a current-to-voltage (I-V) converter 325 is connected to the collector of the transistor Q2 in the differential circuit 321.

The I-V converter 325 comprises an operational amplifier OP which receives a reference voltage $V_{REF}$ at its noninverting input terminal, and a capacitor C31 and a resistor R36 connected in parallel between the inverting input terminal and the output terminal of the operational amplifier OP to thereby form a primary low-pass filter. The I-V converter 325 converts an inflow current or an outflow current into a corresponding voltage to produce an analog signal output.

Next a description will be given on the circuit operation of the D-A converter 306 in the above configuration.

The differential circuit 321 serves to switch the collector current 2Io of the transistor Q5. For example, when the digital signal input is such that the base of the transistor Q2 is turned to a high ("H") level and the base of the transistor Q1 is turned to a low ("L") level respectively, the transistor Q2 is switched on while the transistor Q1 is switched off, whereby the current $I_o$ is absorbed from the I-V converter 325.

As a result, a voltage of $V_{REF}$+R36.$I_O$ is produced at the output terminal of the I-V converter 325.

Meanwhile in another case where the polarity of the digital signal input is inverse to the above, a voltage of $V_{REF}$–R36.$I_O$ is produced at the output terminal of the I-V converter 325.

Figure 24:
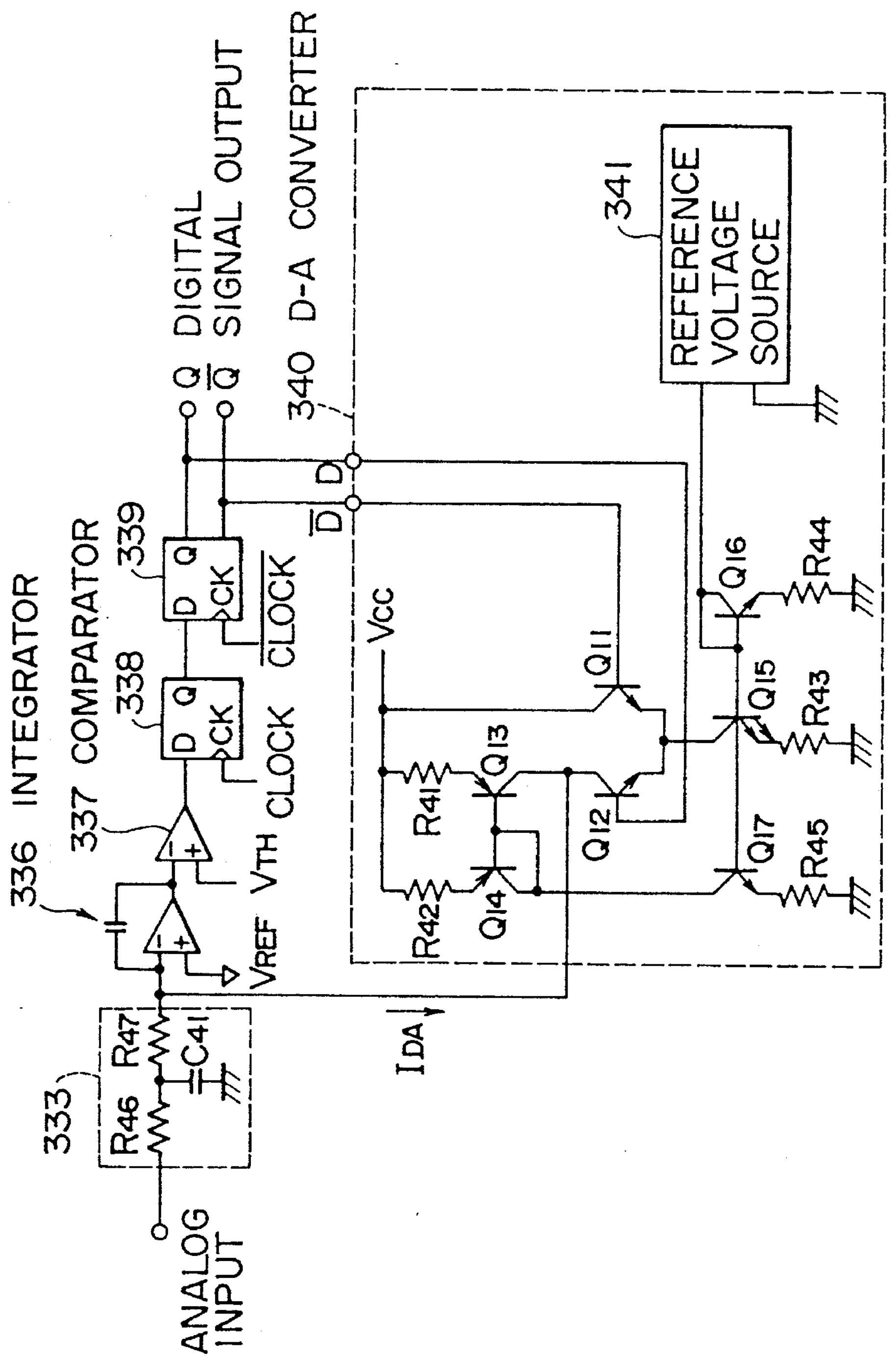
FIG. 24 is a circuit diagram of an exemplary A-D converter shown as a 14th embodiment of the invention.

FIG. 24 is a circuit diagram of a 14th embodiment representing an exemplary configuration of the A-D converter 304 shown in FIG. 22. For prevention of aliasing noise, an analog input signal is supplied to the A-D converter 304 after its band is limited through a filter (LPF) 333.

In FIG. 24, the band-limited analog input signal is processed through an integrator 336 and then is supplied to a comparator 337 where the voltage of the input signal is compared with a reference voltage $V_{TH}$ which is normally set to be equal to the reference voltage $V_{REF}$ of the integrator 336.

The output of the comparator 337 is sampled by a D-type flip-flop (hereinafter referred to as D-FF) 338, and its Q output is further sampled by a D-FF 339.

The reason for cascade connection of two D-FFs is based on the purpose of preventing generation of any sudden data error that may be derived from jitters due to uncertainty in the data input to the D-FFs from the comparator 337. Such data error causes sporadic pulse noise which is uncomfortable auditorily.

The output of the D-FF 339 is delivered as a digital output signal while being supplied to a D-A converter 340 for feedback.

Transistors Q11–Q17, resistors R41–R45 and a reference voltage source 341 constituting the D-A converter 340 correspond respectively to the transistors Q1–Q7, the resistors R31–R35 and the reference voltage source 324 of the D-A converter 306 shown in FIG. 23, and perform the same operation mentioned.

The difference between this D-A converter 340 and the aforesaid D-A converter 306 of FIG. 23 resides in that a I-V converter is not used, and the current output is fed back directly to the integrator 336.

Now a description will be given on the circuit operation of the A-D converter 304 having the above configuration.

When there is no analog input signal, the output of the integrator 336 is in a triangular waveform, and the digital signal output is in a repetitive waveform with a duty factor of 50 percent or so.

If a positive analog signal is inputted in such a state, the output voltage of the integrator 336 is lowered to consequently raise the frequency that the output of the comparator 337 is turned to a high level. Then the duty factor of the digital signal output Q is increased beyond 50 percent and, out of the differential transistors Q11 and Q12 in the D-A converter 340, the transistor Q12 is turned on more frequently.

Therefore the duty factor of the output $I_{DA}$ Of the D-A converter 340 is increased beyond 50 percent to thereby cause feedback.

Meanwhile if the input analog signal is negative, the polarity of the circuit operation is rendered inverse.

Figure 25:
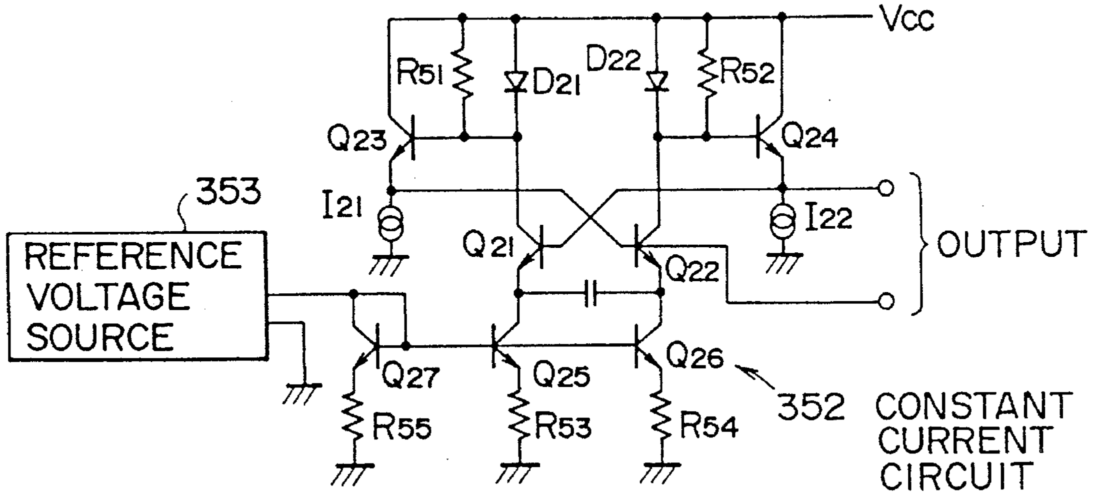
FIG. 25 is a circuit diagram of an exemplary oscillator shown as a 15th embodiment of the invention.

FIG. 25 is a circuit diagram of a 14th embodiment representing an exemplary configuration of the oscillator 307 shown in FIG. 22. This oscillator 307 has a general multivibrator circuit.

In FIG. 25, the voltage between the bases of a pair of transistors Q21 and Q22 is delivered as an oscillation output. The emitters of such transistors Q21 and Q22 are connected to each other via a capacitor C21.

The collector of the transistor Q21 is connected to a power source Vcc via a resistor R51 and a diode D21 in parallel connection while being also connected to the base of a transistor Q23. The collector of the transistor Q23 is connected to the power source Vcc, and its emitter is grounded via a constant current source I21.

Similarly, the collector of the transistor Q22 is connected to the power source Vcc via a resistor R21 and a diode D22 in parallel connection while being also connected to the base of a transistor Q24. The collector of the transistor Q24 is connected to the power source Vcc, and its emitter is grounded via a constant current source I22.

The collectors of transistors Q25, Q26 constituting a constant current circuit 352 are connected respectively to the emitters of the transistors Q21, Q22.

In the constant current circuit 352, the base of a diode-connection transistor Q27 is connected to the bases of the transistors Q25, Q26, and the collector of the transistor Q27 is connected to a reference voltage source 353. Meanwhile the emitters of the transistors Q25–Q27 are grounded via resistors R53–R55 respectively.

In the oscillator 307 of such circuit configuration, its operating current Icc is the sum of the emitter currents flowing in the transistors Q25– Q27 and the currents from the constant current sources I21, I22.

The emitter currents flowing in the transistors Q25–Q27 are stabilized by the reference voltage source 33 while the other currents are constant, so that the operating current Icc is maintained at a fixed value, and no variation is caused in synchronism with the oscillation output.

Consequently, neither the supply voltage of the power source Vcc nor the ground potential in the IC chip is varied by the common impedance of the wiring, and there never occurs a phenomenon that the clock signal appears in the analog circuit. Since it is not necessary to externally provide a crystal oscillator or any resonator such as a coil or a capacitor for the IC, none of the great-amplitude oscillation signal current flows out from the IC to eventually minimize spurious radiation.

As described, the operating currents in the D-A converter 306, the A-D converter 304 and the oscillator 307 shows in FIGS. 23 to 25 are stabilized by the reference voltage sources 324, 341, 353 respectively, so that it becomes possible to extremely diminish the harmful influence that may result from variation of the supply voltage or superposition of the ripples and the clock signal.

In the embodiments mentioned, independent reference voltage sources are provided individually for the D-A converter 306, the A-D converter 304 and the oscillator 307. However, the reference voltage source may be used in common to the circuits in the IC so as to further simplify the circuit configuration.

Figure 26:
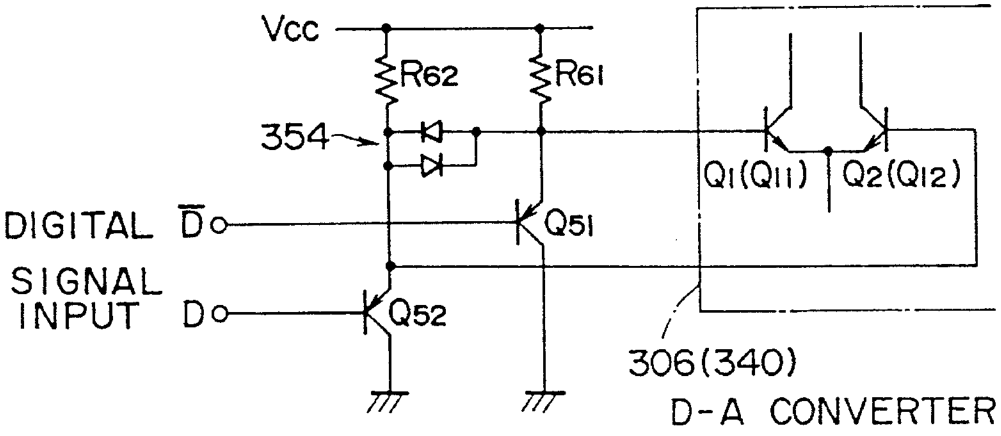
FIG. 26 is a circuit diagram of an exemplary PNP emitter follower circuit shown as a 16th embodiment of the invention.

In the D-A converter 306 of FIG. 23 and the D-A converter 340 of FIG. 24, a PNP emitter follower circuit of FIG. 26 representing a 15th embodiment of the present invention may be used as an interface for the digital signal input. Then it becomes possible to prevent the peak inverse voltage for the differential transistors Q1 (Q11) and Q2 (Q12) in the D-A converter 306 (340).

The PNP emitter follower circuit comprises PNP transistors Q51, Q52 where a digital signal is applied between the bases thereof; resistors R61, R62 connected between the emitters of such transistors and a power source Vcc; and a diode clamper 354 connected between the emitters. And the emitter outputs are supplied to the bases of the differential transistors Q1 (Q11) and Q2 (Q12).

As described above, in the echo generating apparatus of the present invention where an input audio signal digitized by the A-D converter and delayed by the memory circuit is converted into an analog signal by the D-A converter and then is fed back to the input stage via the feedback gain controller and is mixed with the input audio signal in the mixer to be thereby furnished with reverberative echo effect, the memory circuit and the timing circuit are formed by the CMOS process while the other circuits are formed by the bipolar process, and such component circuits are integrated to constitute a single chip. Therefore, different from the conventional apparatus employing BBDs or the like, neither spurious radiation nor deterioration of the S/N is caused by any great-amplitude clock signal, and the number of the required component elements can be reduced to consequently realize reduction of the occupied area and curtailment of the production cost.

Furthermore, the operating current is stabilized by using a reference voltage source in each of the D-A converter, the A-D converter and the oscillator, so that no deterioration is induced in the characteristics inclusive of the gain, the dynamic range and the S/N despite any variation of the supply voltage, whereby high stability is maintained in the apparatus operation.

Particularly in the case of employing digital delay means, the sampling frequency is settable to a lower value, hence facilitating the design of the A-D converter and the D-A converter. And there is attainable a further advantage that a proper operation can be ensured despite a low operation speed of any logic circuit including the memory circuit, whereby the lower limit of the operating voltage range can be extended downward.

In another case of using analog delay means, the number of required delay stages can be diminished to eventually improve the distortion factor of the output signal.

What is claimed is:

1. An echo generating apparatus comprising:

echo effect generating means for producing an output signal having a reverberative echo effect by delaying an input signal;

band limiting means for limiting a frequency band of said output signal of said echo effect generating means;

frequency characteristic compensating means having a frequency characteristic as to boost a portion of said input signal which corresponds to said frequency band attenuated by said band limiting means and producing an output signal therefrom; and calculating means for performing a mathematical calculation using at least said output signal from said frequency characteristic compensating means and an output signal of said band limiting means and delivering a result of match calculation as an output signal, said calculating means including first calculating means, wherein said echo effect generating means includes a plurality of analog delay means for delaying said input signal and providing a plurality of delayed input signal, second calculating means for multiplying said plurality of delayed input signals provided by said plurality of analog delay means by a coefficient selected to achieve a desired echo effect and adding or substracting the multiplied outputs to achieve said desired echo effect, and clock generating means for generating an operation clock signal for said plurality of analog delay means, and wherein said first calculating means performs said mathematical calculation using at least said output signal of said band limiting means and said output signal of said frequency characteristic compensating means.

2. The apparatus according to claim 1, wherein said plurality of analog delay means further comprises a plurality of cascade-connected analog delay means for sequentially delaying said input signal.

3. The apparatus according to claim 2, wherein said second calculating means multiplies each of said output signals of said plurality of analog delay means by a corresponding predetermined coefficient.

4. An echo generating apparatus comprising:

echo effect generating means for producing an output signal having a reverberative echo effect by delaying an input signal;

band limiting means for limiting a frequency band of said output signal of said echo effect generating means;

frequency characteristic compensating means having a frequency characteristic as to boost a portion of said input signal which corresponds to said frequency band attenuated by said band limiting means and producing an output signal therefrom; and calculating means for performing a mathematical calculation between said output signal from said frequency characteristic compensating means and an output signal of said band limiting means and delivering a result of such calculation as an output signal, said calculating means including first calculating means, wherein said echo effect generating means includes second calculating means for adding said input signal to said output signal of said band limiting means, a plurality of cascade-connected analog delay means for sequentially delaying an output signal of said second calculating means, clock generating means for generating an operation clock signal for said plurality of analog delay means, and third calculating means for multiplying a plurality of delayed output signals provided by said plurality of analog delay means by a coefficient selected to achieve a desired echo effect and adding or subtracting the multiplied outputs to achieve said desired echo effect, and wherein said first calculating means performs said mathematical calculation using at least said output signal of said band limiting means, said output signal of said second calculating means and said output signal of said frequency characteristic compensating means.

5. The apparatus according to claim 4, wherein said third calculating means multiplies each of said output signals of said plurality of analog delay means by a corresponding predetermined coefficient.

6. An echo generating apparatus comprising:

echo effect generating means for producing an output signal having a reverberative echo effect by delaying an input signal;

band limiting means for limiting a frequency band of said output signal of said echo effect generating means;

frequency characteristic compensating means having a frequency characteristic as to boost a portion of said input signal which corresponds to said frequency band attenuated by said band limiting means and producing an output signal therefrom; and calculating means for performing a mathematical calculation using at least said output signal from said frequency characteristic compensating means and an output signal of said band limiting means and delivering a result of such calculation as an output signal, said calculating means including first calculating means for performing said mathematical calculation, wherein said echo effect generating means includes an A-D converter for digitizing said input signal, a plurality of cascade-connected memory means for sequentially delaying an output signal of said A-D converter, second calculating means for multiplying output signals of said respective plurality of memory means by a coefficient selected to achieve a desired echo effect and adding or substracting the multiplied outputs to achieve said desired echo effect, a D-A converter for converting an output signal of said second calculating means into an analog signal, and clock generating means for generating operation clock signals for said A-D converter, said plurality of memory means and said D-A converter.

7. An echo generating apparatus comprising:

echo effect generating means for producing an output signal having a reverberative echo effect by delaying an input signal;

band limiting means for limiting a frequency band of said output signal of said echo effect generating means;

frequency characteristic compensating means having a frequency characteristic as to boost a portion of said input signal which corresponds to said frequency band attenuated by said band limiting means and producing an output signal therefrom; and calculating means for performing a mathematical calculation using at least said output signal from said frequency characteristic compensating means and an output signal of said band limiting means and delivering a result of such calculation as an output signal, said calculating means including first calculating means, wherein said echo effect generating means includes second calculating means for adding said input signal to said output signal of said band limiting means, an A-D converter for digitizing an output signal of said second calculating means, a plurality of cascade-connected memory means for sequentially delaying an output signal of said A-D converter, third calculating means for multiplying delayed output signals provided by said plurality of memory means by a coefficient selected to achieve a desired echo effect and adding or subtracting the multiplied outputs to achieve said desired echo effect, a D-A converter for converting an output signal of said third calculating means into an analog signal, and clock generating means for generating operation clock signals for said A-D converter, said plurality of memory means, and said D-A converter, and wherein said first calculating means performs said mathematical calculation using at least said output signal of said band limiting means, said output signal of said second calculating means and an output signal of said frequency characteristic compensating means.

8. The apparatus according to claim 7, wherein said third calculating means multiplies each of said output signals of said plurality of memory means by a corresponding predetermined coefficient.

9. An echo generating apparatus comprising:

echo effect generating means for producing a reverberative echo effect by delaying an input signal;

band limiting means for limiting a plurality of frequency bands of a respective plurality of output signals of said echo effect generating means;

frequency characteristic compensating means having a frequency characteristic as to boost within said input signal at least one of said plurality of frequency bands attenuated by said band limiting means and producing an output signal therefrom; and calculating means for performing a mathematical calculation using at least said output signal from said frequency characteristic compensating means and an additional output signal of said echo effect limiting means and delivering a result of such calculation as an output signal, said calculating means including first calculating means, wherein said echo effect generating means includes second calculating means for performing a second mathematical calculation using said input signal and an output signal of said band limiting means and supplying an output signal therefrom as said additional output signal of said echo effect generating means, a plurality of cascade-connected delay means for sequentially delaying said output signal of said second calculating means and supplying a plurality of delayed output signals as said plurality of output signals of said echo effect generating means, and clock generating means for generating an operation clock signal for said plurality of delay means, wherein said band limiting means comprises a plurality of band limiting filters for limiting said plurality of frequency bands of said respective plurality of delayed output signals of said respective plurality of delay means and supplying output signals therefrom, wherein said plurality of frequency bands limited by said respective plurality of band limiting filters are mutually different, and third calculating means for multiplying said output signals of said plurality of band limiting filters by a respective plurality of coefficients selected to achieve a desired echo effect, adding or subtracting the multiplied outputs to achieve said desired echo effect, and supplying an output signal therefrom as said output signal of said band limiting means, and wherein said first calculating means performs said mathematical calculation using said output signal of said second calculating means, at least one of said output signals of said plurality of band limiting filters, and said output signal of said frequency characteristic compensating means.

10. The apparatus according to claim 9, wherein said third calculating means multiplies each of said output signals of said plurality of band limiting filters by a corresponding predetermined coefficient.

11. An echo generating apparatus comprising:

a first mixer for mixing an input audio signal with another signal supplied thereto;

a first filter receiving the mixed input audio signal from the first mixer and producing a filtered mixed audio signal;

an A-D converter for digitizing said filtered mixed audio signal from said first filter at a sampling frequency between 200 kHz and 20 MHz and comprising an integrator for integrating said filtered mixed audio signal, a comparator for comparing an output of said integrator with predetermined reference voltage, a sampling circuit for sampling an output of said comparator at said sampling frequency between 200 kHz and 20 MHz and delivering a signal therefrom as a digital signal output, and a feedback D-A converter for converting said digital signal output into a second analog signal and feeding said second analog signal back to said integrator, said feedback D-A converter including a constant current circuit for supplying a current that is stabilized by a reference voltage source, a differential circuit consisting of a pair of transistors which perform a differential operation while receiving digital input signals at bases thereof and serve to switch said current flowing in said constant current circuit, and a current supply circuit for supplying a current that is in a fixed relation to said current of said constant current circuit to a collector of one of said pair of transistors, wherein a collector output of said one of said pair of transistors is fed back to said integrator;

a memory circuit for delaying by sequentially transferring the digital signal output of said A-D converter;

a D-A converter for converting an output signal of said memory circuit into an analog signal;

a second filter for eliminating a clock component and a noise component included in an output signal of said D-A converter;

a feedback gain controller for setting a desired feedback gain in a feedback path through which an output signal of said second filter is fed back as said another signal to said first mixer;

a second mixer for mixing said output signal of said second filter with said input audio signal, and delivering a signal therefrom as an output audio signal;

a timing circuit for generating an operation clock signal and a timing signal for each of said A-D converter, said memory circuit, and said D-A converter; and an oscillator for generating an original oscillation signal supplied to said timing circuit;

wherein said memory circuit and said timing circuit are CMOS circuits, while other circuits are bipolar circuits, and all component circuits are integrated to constitute a single IC chip, and wherein said first filter attenuates aliasing noise produced by the A-D converter.

12. The apparatus according to claim 11, wherein said D-A converter comprises:

a constant current circuit of which current is stabilized by a reference voltage source;

a differential circuit consisting of a pair of transistors which perform a differential operation while receiving digital input signals at bases thereof and serve to switch said current flowing in said constant current circuit; and a current supply circuit for supplying a current, which is in a fixed relation to said current of said constant current circuit, to a collector of one of said pair of transistors, wherein a collector output of said one of said pair of transistors is delivered as an analog signal output.

13. The apparatus according to claim 12, wherein said D-A converter has, in a preceding stage of said differential circuit, PNP emitter follower circuit serving as an interface.

14. The apparatus according to claim 11, wherein said oscillator comprises a multivibrator circuit, and a constant current circuit for driving said multivibrator circuit with a current stabilized by a reference voltage source.

15. The apparatus according to claim 11, wherein said feedback D-A converter has, in a preceding stage of said differential circuit, a PNP emitter follower circuit serving as an interface.

* * * * *